US006721162B2

(12) United States Patent
Weldon et al.

(10) Patent No.: US 6,721,162 B2
(45) Date of Patent: Apr. 13, 2004

(54) ELECTROSTATIC CHUCK HAVING COMPOSITE DIELECTRIC LAYER AND METHOD OF MANUFACTURE

(75) Inventors: Edwin C. Weldon, Los Gatos, CA (US); Kenneth S. Collins, San Jose, CA (US); Arik Donde, Cupertino, CA (US); Brian Lue, Mountain View, CA (US); Dan Maydan, Los Altos Hills, CA (US); Robert J. Steger, Cupertino, CA (US); Timothy Dyer, Tempe, AZ (US); Ananda H. Kumar, Milpitas, CA (US); Alexander M. Veytser, Mountain View, CA (US); Kadthala R. Narendrnath, San Jose, CA (US); Semyon L. Kats, San Francisco, CA (US); Arnold Kholodenko, San Francisco, CA (US); Shamouil Shamouilian, San Jose, CA (US); Dennis S. Grimard, Ann Arbor, MI (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/095,914

(22) Filed: Mar. 12, 2002

(65) Prior Publication Data

US 2002/0135969 A1 Sep. 26, 2002

Related U.S. Application Data

(60) Division of application No. 09/596,108, filed on Jun. 16, 2000, which is a division of application No. 08/965,690, filed on Nov. 6, 1997, now Pat. No. 6,108,189, which is a continuation-in-part of application No. 08/639,596, filed on Apr. 26, 1996, now Pat. No. 5,720,818.

(51) Int. Cl.$^7$ .............................................. H02N 13/00

(52) U.S. Cl. ........................................ 361/234; 279/128
(58) Field of Search ................................ 361/230–235; 279/128

(56) References Cited

U.S. PATENT DOCUMENTS

| 4,384,918 | A | 5/1983 | Abe |
| 4,412,133 | A | 10/1983 | Eckes et al. |
| 4,480,284 | A | 10/1984 | Tojo et al. |
| 4,645,218 | A | 2/1987 | Ooshio et al. |
| 4,665,463 | A | 5/1987 | Ward et al. |

(List continued on next page.)

FOREIGN PATENT DOCUMENTS

| EP | 635869 A1 | 4/1994 |
| EP | 439000 B1 | 9/1994 |

(List continued on next page.)

OTHER PUBLICATIONS

Daviet, et al., "Electrostatic Clamping Applied to Semiconductor Plasma Processing—I. Theoretical Modeling," *J. Electrochem. Soc.*, 140(11):3245–3255 (Nov. 1993).

(List continued on next page.)

*Primary Examiner*—Kim Huynh
(74) *Attorney, Agent, or Firm*—Janah & Associates

(57) ABSTRACT

An electrostatic chuck has an electrode capable of being electrically charged to electrostatically hold a substrate. A composite layer covers the electrode. The composite layer comprises (1) a first dielectric material covering a central portion of the electrode, and (2) a second dielectric material covering a peripheral portion of the electrode, the second dielectric material having a different composition than the composition of the first dielectric material. The chuck is useful in a plasma process chamber to process substrates, such as semiconductor wafers.

20 Claims, 16 Drawing Sheets

U.S. PATENT DOCUMENTS

| | | | |
|---|---|---|---|
| 4,832,781 A | 5/1989 | Mears | |
| 5,055,964 A | 10/1991 | Logan et al. | |
| 5,104,834 A | 4/1992 | Watanabe et al. | |
| 5,117,121 A | 5/1992 | Watanabe et al. | |
| 5,151,845 A | 9/1992 | Watanabe et al. | |
| 5,166,856 A | 11/1992 | Liporace et al. | |
| 5,191,506 A | 3/1993 | Logan et al. | |
| 5,221,450 A * | 6/1993 | Hattori et al. | 204/192.32 |
| 5,258,047 A | 11/1993 | Tosikue et al. | |
| 5,275,683 A | 1/1994 | Arami et al. | |
| 5,280,156 A | 1/1994 | Niori et al. | |
| 5,315,473 A | 5/1994 | Collins et al. | |
| 5,324,053 A | 6/1994 | Kubota et al. | |
| 5,325,261 A | 6/1994 | Horwitz | |
| 5,350,479 A | 9/1994 | Collins et al. | |
| 5,382,469 A | 1/1995 | Kubota et al. | |
| 5,463,526 A | 10/1995 | Mundt | |
| 5,542,559 A | 8/1996 | Kawakami et al. | |
| 5,606,485 A * | 2/1997 | Shamouilian et al. | 361/234 |
| 5,631,803 A * | 5/1997 | Cameron et al. | 361/234 |
| 5,636,098 A * | 6/1997 | Salfelder et al. | 361/234 |
| 5,720,818 A | 2/1998 | Donde et al. | |
| 5,745,331 A * | 4/1998 | Shamouilian et al. | 361/234 |
| 5,748,436 A * | 5/1998 | Honma et al. | 361/234 |
| 5,801,915 A * | 9/1998 | Kholodenko et al. | 361/234 |
| 5,822,171 A * | 10/1998 | Shamouilian et al. | 361/234 |
| 5,847,918 A * | 12/1998 | Shufflebotham et al. | 361/234 |
| 5,886,863 A | 3/1999 | Nagasaki et al. | |
| 5,909,354 A * | 6/1999 | Harada et al. | 361/234 |
| 6,055,150 A * | 4/2000 | Clinton et al. | 361/234 |
| 6,108,189 A * | 8/2000 | Weldon et al. | 361/234 |
| 6,141,203 A * | 10/2000 | Sherman | 361/234 |

FOREIGN PATENT DOCUMENTS

| | | |
|---|---|---|
| EP | 791956 A | 8/1996 |
| JP | 2-27748 | 1/1990 |
| JP | 4-367247 | 12/1992 |
| JP | 6232243 | 8/1994 |
| JP | 9017850 | 1/1997 |

OTHER PUBLICATIONS

Daviet, et al., "Electrostatic Clamping Applied to Semiconductor Plasma Processing—II. Experimental Results," *J. Electrochem. Soc.*, 140(11):3256–3261 (Nov. 1993).

Nakasuji, et al., "Low Voltage and High Speed Operating Electrostatic Wafer Chuck," *J. Vac. Sci. Technol. A.*, 10(6):3573–3578 (Nov./Dec. 1992).

Watanabe, et al., "Effect of Additives on the Electrostatic Force of Alumina Electrostatic Chucks," *J. of the Ceramic Soc. of Jpn*, 100(1):1–6 (1992).

Watanabe, et al., "Electrostatic Force and Absorption Current of Alumina Electrostatic Chuck," *Jpn. J. Appl. Phys.*, 31(Pt. 1, No. 7):2145–2150 (1992).

Watanabe, et al., "Relationship between Electrical Resistivity and Electrostatic Force of Alumina Electrostatic Chuck," *Jpn. J. Appl. Phys.*, 32(Pt. 1, No. 2):864–871 (1993).

Watanabe, et al., "Resistivity and Microstructure of Alumina Ceramics Added with $TiO_2$ Fired in Reducing Atmosphere," *J. of the Ceramic Soc. of Jpn Int. Ed.*, 101:1076–1083 (No date).

Wright, et al., "Low Temperature Etch Chuck: Modeling and Experimental Results of Heat Transfer and Wafer Temperature," *J. Vac. Sci. Technol. A*, 10(4):1065–1070 (Jul./Aug. 1992).

U.S. patent application entitled, "Electrostatic Chuck with Polymeric Impregnation and Method of Making"; filed Jan. 12, 1995; Ser. No. 08/372,177.

U.S. patent application entitled, "Method for Dechucking a Workpiece from an Electrostatic Chuck"; filed Jun. 7, 1995; Ser. No. 08/475,368.

U.S. patent application entitled, "Surface Preparation to Enhance the Adhesion of a Dielectric Layer"; filed Apr. 26, 1996; Ser. No. 08/639,156; Inventor: Arik Donde.

* cited by examiner

ELECTROSTATIC CHUCK HAVING COMPOSITE DIELECTRIC LAYER AND METHOD OF MANUFACTURE

CROSS-REFERENCE

This application is a divisional of U.S. patent application Ser. No. 09/596,108, filed Jun. 16, 2000, entitled, "DIELECTRIC COVERED ELECTROSTATIC CHUCK", which is a divisional of application Ser. No. 08/965,690, filed on Nov. 6, 1997, now U.S. Pat. No. 6,108,189, issued on Aug. 22, 2000, entitled "ELECTROSTATIC CHUCK HAVING IMPROVED GAS CONDUITS", which is a continuation-in-part of application Ser. No. 08/639,596, filed on Apr. 26, 1996, now U.S. Pat. No. 5,720,818, issued Feb. 24, 1998, entitled, "Conduits for Flow of Heat Transfer Fluid to the Surface of an Electrostatic Chuck," by Weldon et al., all of which are incorporated herein by reference.

BACKGROUND

The present invention relates to an electrostatic chuck for holding substrates in a process chamber.

Electrostatic chucks are used to hold substrates in various applications, including for example, holding a silicon wafer in a process chamber during semiconductor fabrication. A typical electrostatic chuck comprises an electrode covered by an insulator or dielectric layer. When the electrode of the chuck is electrically biased with respect to the substrate by a voltage, an attractive electrostatic force is generated that holds the substrate to the chuck. In monopolar electrode chucks, an electrically charged plasma above the substrate induces electrostatic charge in the substrate that electrostatically holds the substrate to the chuck. A bipolar electrode chuck comprises bipolar electrodes that are electrically biased relative to one another to provide the electrostatic attractive force.

With reference to FIGS. 1a and 1b, the electrostatic attractive force generated by electrostatic chucks 10a, 10b can be of different types. As schematically illustrated in FIG. 1a, a dielectric layer 11 with a high electrical resistance results in the generation of coulombic electrostatic forces from the accumulation of electrostatic charge in the substrate 12 and in the electrode 13 of the chuck 10a. The coulombic electrostatic force is described by the equation:

$$F = \frac{1}{2}\varepsilon_0\varepsilon_r\left(\frac{V}{t}\right)^2$$

where $\varepsilon_0$ and $\varepsilon_r$ are the dielectric constant of vacuum and relative dielectric constant of the dielectric layer 11, respectively, V is the voltage applied to the electrode 13, and t is the thickness of the dielectric layer. The electrostatic force increases with increased relative dielectric constant $\varepsilon_r$ of the dielectric layer 11.

With reference to FIG. 1b, Johnsen-Rahbek electrostatic attraction forces occur when an interface 14 of a low resistance dielectric layer 15 and the substrate 12 comprises an interfacial contact resistance much greater than the resistance of the dielectric layer 15, i.e., when the resistance of the dielectric layer 15 from about $10^{11}$ to about $10^{14}$ Ωcm. In these chucks, free electrostatic charge drifts through the dielectric layer 15 under the influence of the electric field and accumulates at the interface of the dielectric layer 15 and the substrate 12, as schematically illustrated in FIG. 1b. The charge accumulated at the interface generates a potential drop represented by the equation:

$$F = \frac{1}{2}\varepsilon_0\left(\frac{V}{\delta}\right)^2$$

where δ denotes the contact resistance of the air gap 14 between the substrate 12 and the low resistance dielectric layer 15. The Johnsen-Rahbek electrostatic attractive force is much larger for an applied voltage than that provided by coulombic forces because (i) polarization in the dielectric layer 15, and (ii) free charges at the interface 14 (which have a small separation distance from the accumulated charges in the substrate) combine to enhance electrostatic force. A strong electrostatic force securely clamps the substrate 12 onto the chuck and improves thermal transfer rates. Also, it is desirable to operate the chuck using lower voltages to reduce charge-up damage to active devices on the substrate 12.

It is known to use ceramic layers to fabricate the low conductivity Johnsen-Rahbek electrostatic chucks. For example, various formulations of $Al_2O_3$ doped with low levels of 1–3 wt % $TiO_2$ to form low resistance ceramic layers are disclosed in Watanabe et al., "Relationship between Electrical Resistivity and Electrostatic Force of Alumina Electrostatic Chuck," *Jpn. J. Appl. Phys.*, Vol. 32, Part 1, No. 2, 1993; and "Resistivity and Microstructure of Alumina Ceramics Added with $TiO_2$ Fired in Reducing Atmosphere," *J. of the Am. Cer. Soc. of Japan Intl. Edition*, Vol. 101, No. 10, pp. 1107–1114 (July 1993). In another example, U.S. Pat. No. 4,480,284 discloses a chuck having a ceramic dielectric layer made by flame spraying $Al_2O_3$, $TiO_2$, or $BaTiO_3$ over an electrode and impregnating the pores of the ceramic layer with a polymer. Whereas pure $Al_2O_3$ ceramic has a resistivity on the order of $1\times10^{14}$ ohm cm, the alumina/(1–3 wt % titania) ceramic formulations typically have lower resistivities on the order of $1\times10^{11}$ to $1\times10^{13}$, and consequently are more suitable for fabricating Johnsen-Rahbek electrostatic chucks. However, one problem with such ceramic layers is that the volume resistivity of the ceramic decreases to low values with increasing temperature, which results in large current leakages that exceed the capacity of the chuck power supply.

Another problem with low resistance ceramic formulations is their low charge accumulation and dissipation response time, i.e., the speed at which electrostatic charge accumulates or dissipates in the chuck. The charge accumulation time is the time to reach electrostatic charge saturation and depends on the resistivity of the dielectric layer. Typical resistivities of conventional ceramics of greater than $1\times10^{12}$ Ωcm result in relatively slow charging times, often as high as 5 to 10 seconds. The high resistance also results in a slow dechucking time, which is the time it takes for the electrostatic charge accumulated in the chuck to dissipate after the voltage applied to the electrode is turned off. It is desirable for the chuck to provide rapid chucking and dechucking to provide high process throughput.

Yet another problem with conventional electrostatic chucks occurs during their use in semiconductor processes that use plasma environments and, in particular, high density plasma environments. A plasma is an electrically conductive gaseous medium formed by inductively or capacitively coupling RF energy into the process chamber. High density plasmas which are generated using a combined inductive and capacitive coupling source typically comprise a thin plasma sheath having a large number per unit volume of energetic plasma ions. The high density plasma species permeate into the interfacial gap between the substrate and the chuck, or the potential differences at the backside of the substrate cause formation of glow discharges and electrical arcing at the backside of the substrate. It is desirable to have an interfacial region that is more resistant to plasma permeation and that can reduce plasma formation even when charged plasma species penetrate into the gap.

The formation of glow discharges and arcing at the interfacial gap below the substrate causes additional problems when the substrate is cooled or heated by a heat transfer gas, such as helium, supplied to the interface between the chuck and the substrate via channels in the body of the chuck. The heat transfer gas serves to enhance thermal heat transfer rates. However, the pressure of the heat transfer gas below the substrate counteracts and reduces the electrostatic clamping force exerted on the substrate. Because the semiconductor plasma processing is typically carried out at low pressures, the helium gas pressure increases the size of the interfacial gap below the substrate, causing increased permeation and penetration of the high density plasma into the gap. Additional problems occur when the heat transfer gas passes through gas holes in the chuck that are surrounded by the electrode of the chuck which is supplied by a high power AC voltage. Instantaneous changes in potentials can ionize the heat transfer gas adjacent to the gas distribution holes, particularly when the diameter of the gas hole is relatively large and provides a long mean free path which allows avalanche breakdown of gas molecules in the gas holes. Ceramic chucks typically have large diameter gas holes because it is difficult to drill small holes having diameters less than 0.5 mm because the ceramic at the edges of the holes shatters or chips off during drilling. Arcing and glow discharges within these large diameter gas holes in ceramic chucks cause deterioration of the regions adjacent to the gas distribution holes, including the adjacent dielectric layer and overlying substrate.

Thus, there is a need for an electrostatic chuck that reduces plasma glow discharges and arcing in the interfacial gap between a substrate and chuck, particularly when heat transfer gas is provided to the interface. There is also a need for an electrostatic chuck that deactivates or prevents plasma formation at the gas feeding apertures in the chuck. There is a further need for a chuck having a low conductivity dielectric covering or enclosing the electrode which provides higher electrostatic clamping forces, rapid chucking and dechucking response times, and controlled leakage of current from the electrode.

SUMMARY

An electrostatic chuck comprising:
an electrode capable of being electrically charged to electrostatically hold a substrate; and
a composite layer covering the electrode, the composite layer comprising:
(1) a first dielectric material covering a central portion of the electrode; and
(2) a second dielectric material covering a peripheral portion of the electrode, the second dielectric material having a different composition than the composition of the first dielectric material.

An electrostatic chuck comprising:
an electrode capable of being electrically charged to generate an electrostatic charge to hold a substrate; and
a composite layer covering the electrode, the composite layer comprising:
(1) a first dielectric material covering a central portion of the electrode, the first dielectric material having a resistivity of from about $5 \times 10^9$ $\Omega$cm to about $8 \times 10^{10}$ $\Omega$cm; and
(2) a second dielectric material covering a peripheral portion of the electrode, the second dielectric material having a resistivity of from about $1 \times 10^{11}$ to about $1 \times 10^{20}$ $\Omega$cm.

An electrostatic chuck fabrication process comprising:
maintaining a chuck electrode facing arcing electrodes;
forming an electrical arc between the arcing electrodes;
flowing a gas stream through the electrical arc to absorb heat from the electrical arc; and
spraying a ceramic powder into the heated gas stream so that the ceramic powder impinges on the chuck electrode to form a ceramic layer thereon.

An electrostatic chuck fabrication process comprising:
maintaining a chuck electrode facing arcing electrodes;
forming an electrical arc between the arcing electrodes;
flowing an inert gas stream through the electrical arc to absorb heat from the electrical arc; and
spraying a ceramic powder into the heated inert gas stream so that the ceramic powder impinges on the chuck electrode to form a ceramic layer having an electrical resistance of from about $5 \times 10^9$ to about $8 \times 10^{10}$ $\Omega$cm.

An electrostatic chuck comprising:
an electrode capable of being electrically charged to electrostatically hold a substrate; and
a dielectric layer covering at least a portion of an electrode, the dielectric layer having a resistivity in a range $\Delta\rho$ defined by:
(1) a first lower resistivity $\rho_L$ that is sufficiently low (i) to allow a leakage current to flow from the electrode when an electrical charge is applied to the electrode to form accumulated electrostatic charge in the dielectric layer, and (ii) to allow the accumulated electrostatic charge to dissipate in less than about 1 second, when the electrical charge applied to the electrode is terminated; and
(2) a second higher resistivity $\rho_H$ that is sufficiently high to maintain the accumulated electrostatic charge in the dielectric layer during operation of the chuck.

DRAWINGS

These features, aspects, and advantages of the present invention will become better understood with regard to the following description, appended claims, and accompanying drawings which illustrate versions of the invention, where:

FIG. 5b is a sectional side schematic view showing an electrical isolator comprising dielectric coatings on a gas flow conduit in the annular ring of FIG. 5a;

FIG. 5c is a sectional side schematic view showing an electrical isolator comprising a dielectric insert in a gas flow conduit in the annular ring of FIG. 5a;

FIG. 5d is a sectional side schematic view showing an electrical isolator comprising a porous plug of dielectric material in a gas flow conduit in the annular ring of FIG. 5a;

DESCRIPTION

Figure 1B:
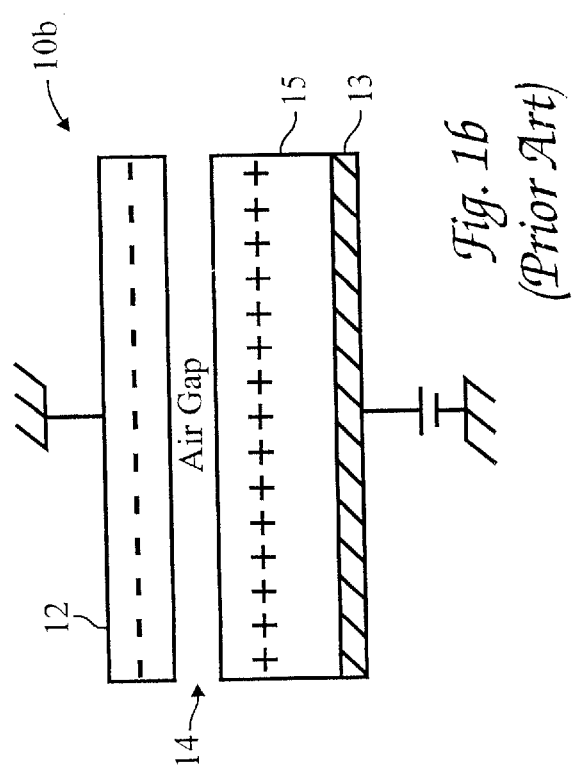
FIG. 1b (Prior Art) is a schematic view of an electrostatic chuck that operates by Johnsen-Rahbek electrostatic forces.
Figure 1A:
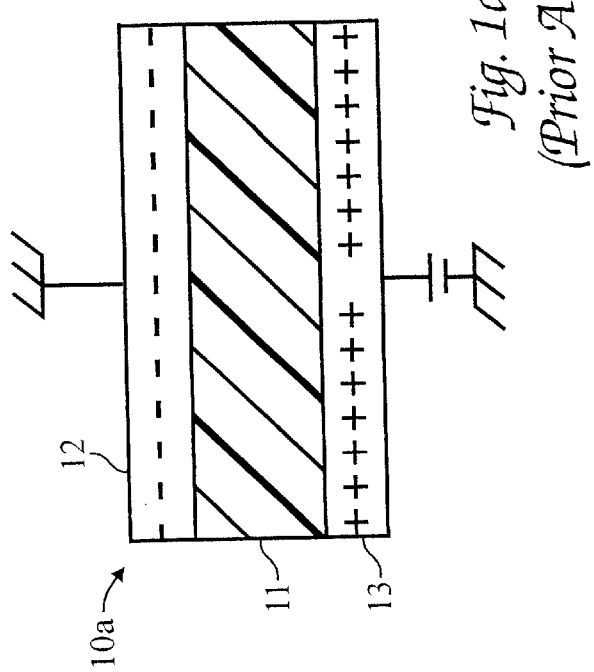
FIG. 1a (Prior Art) is a schematic view of an electrostatic chuck that operates by coulombic electrostatic forces.
Figure 2:
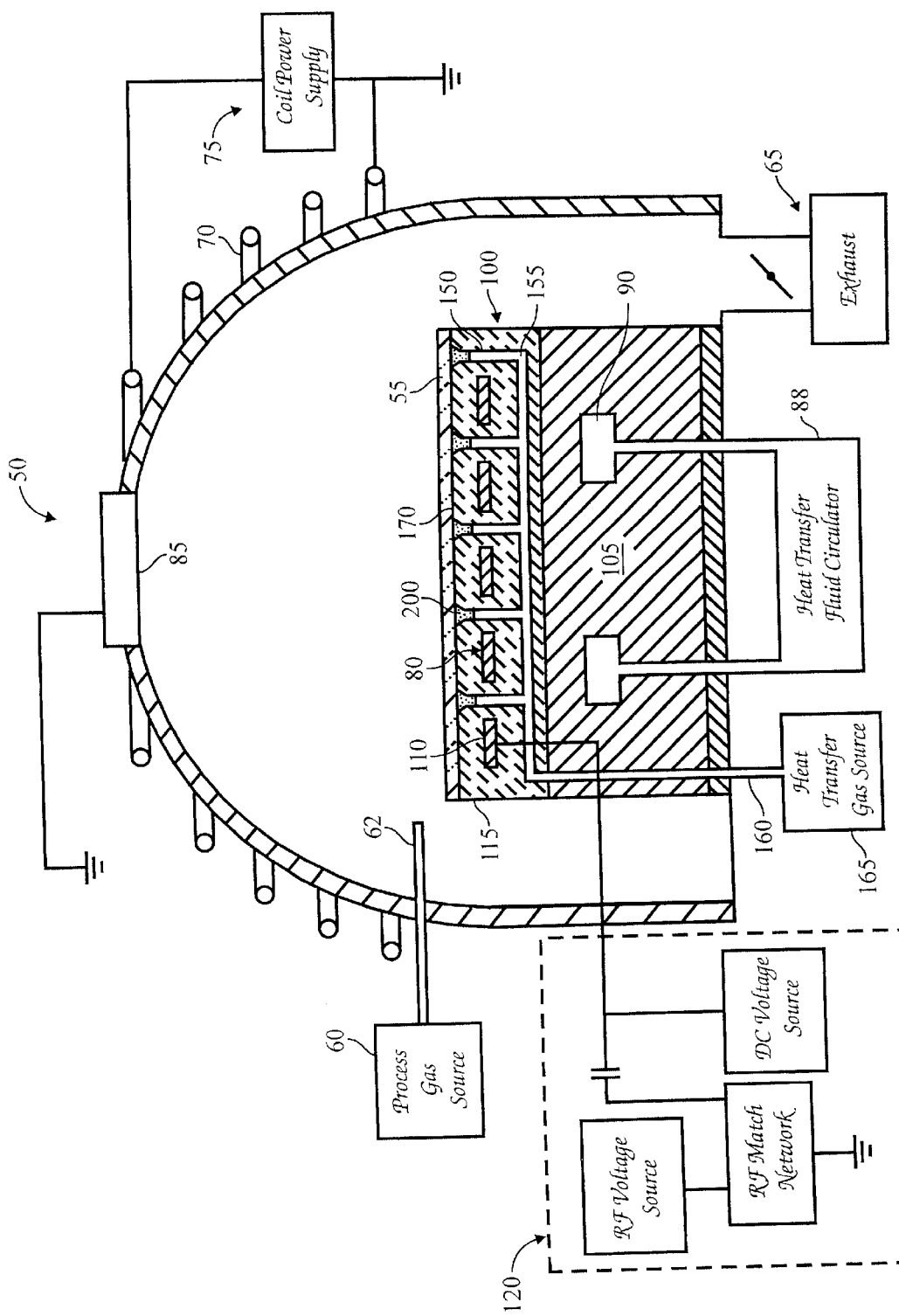
FIG. 2 is a schematic side view of a process chamber comprising an embodiment of the electrostatic chuck of the present invention.

The present invention relates to an electrostatic chuck that exhibits reduced plasma glow discharges and electrical arcing at the interface of the substrate and chuck and provides fast chucking and dechucking response times. The electrostatic chuck is described in the context of holding substrates in a process chamber, as illustrated in FIG. 2. The process chamber 50 schematically represents an "HDP" decoupled plasma chamber commercially available from Applied Materials Inc., Santa Clara, Calif., and described in commonly assigned patent application Ser. No. 07/941,507, filed on Sep. 8, 1992, which is incorporated herein by reference. The particular embodiment of the process chamber 50 is suitable for plasma processing of semiconductor substrates 55; however, the present invention can also be used with other process chambers or in other processes without deviating from the scope of the invention.

The process chamber 50 includes a process gas source 60 that feeds a gas distributor 62 for introducing process gas into the chamber 50 and a throttled exhaust 65 for exhausting gaseous byproducts. A plasma is formed from the process gas using a plasma generator that couples RF energy into the chamber, such as an inductor coil 70 adjacent to the process chamber 50 powered by a coil power supply 75. The chamber also includes cathode and anode electrodes 80, 85 that capacitively couple energy into the chamber 50. The frequency of the RF voltage applied to the cathode and anode 80, 85 and/or the inductor coil 70 is typically from about 50 Khz to about 60 MHZ, and more typically about 13.56 MHZ; and the power level of the RF voltage/current applied to the coil or process electrodes is typically from about 100 to about 5000 Watts.

An electrostatic chuck 100 is used to hold a substrate 55 for plasma processing in the process chamber 50. In one version, the electrostatic chuck 100 comprises an electrode 110 covered by, and more preferably embedded in, a dielectric member 115 that electrically isolates the electrode from the substrate. The electrode 110 embedded in the dielectric member 115 provides increased electrical isolation from the plasma environment. Optionally, a base 105 supports the chuck, and a heat transfer fluid circulator 88 circulates heat transfer fluid through the channels 90 in the base to transfer heat to or from the chuck 100. In another version, shown for example in FIG. 3a, the chuck 100 is formed by a dielectric member 115 comprising a layer of dielectric material covering a metal plate that serves as the electrode 110. By "dielectric member" 115 it is meant both the dielectric layer covering the electrode 110 and the unitary dielectric member having the electrode 110 embedded therein.

Referring to FIG. 2, to operate the chuck 100, the process chamber 50 is evacuated to a low pressure, and a robot arm (not shown) transports a substrate 55 from a load-lock transfer chamber through a slit valve into the chamber 50. A lift finger assembly (not shown) has lift fingers that are elevated through the chuck 100 by a pneumatic lift mechanism. The robot arm places the substrate 55 on the tips of the lift fingers, and the pneumatic lift mechanism, under the control of a computer system, lowers the substrate onto the chuck 100. After the substrate is placed on the chuck 100, the electrode 110 of the chuck is electrically biased with respect to the substrate 55 by a chuck voltage supply 120 to electrostatically hold the substrate. After process completion, the pneumatic lift mechanism raises the lift pins to raise the substrate 55 off the chuck 100, allowing the substrate to be removed by the robotic arm. Before raising the lift pins, the substrate 55 can be electrically decoupled or dechucked by dissipating the residual electrical charges holding the substrate to the chuck (after the voltage to the electrode is turned off) by grounding the electrode 110 and/or substrate 55.

Figure 3A:
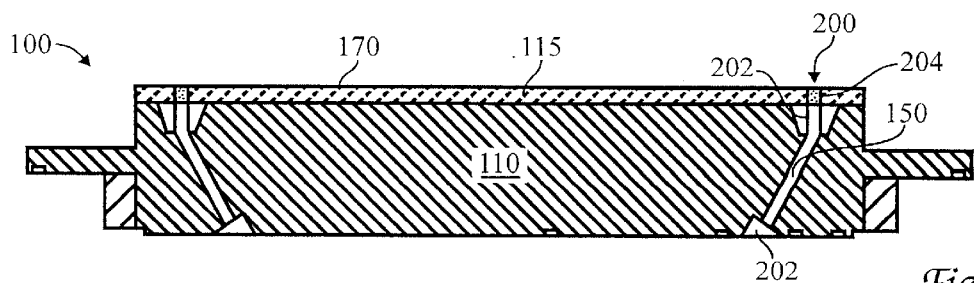
FIG. 3a is a schematic side view of an electrostatic chuck comprising a unitary body of dielectric material enclosing an electrode and having gas flow conduits extending therethrough.
Figure 3B:
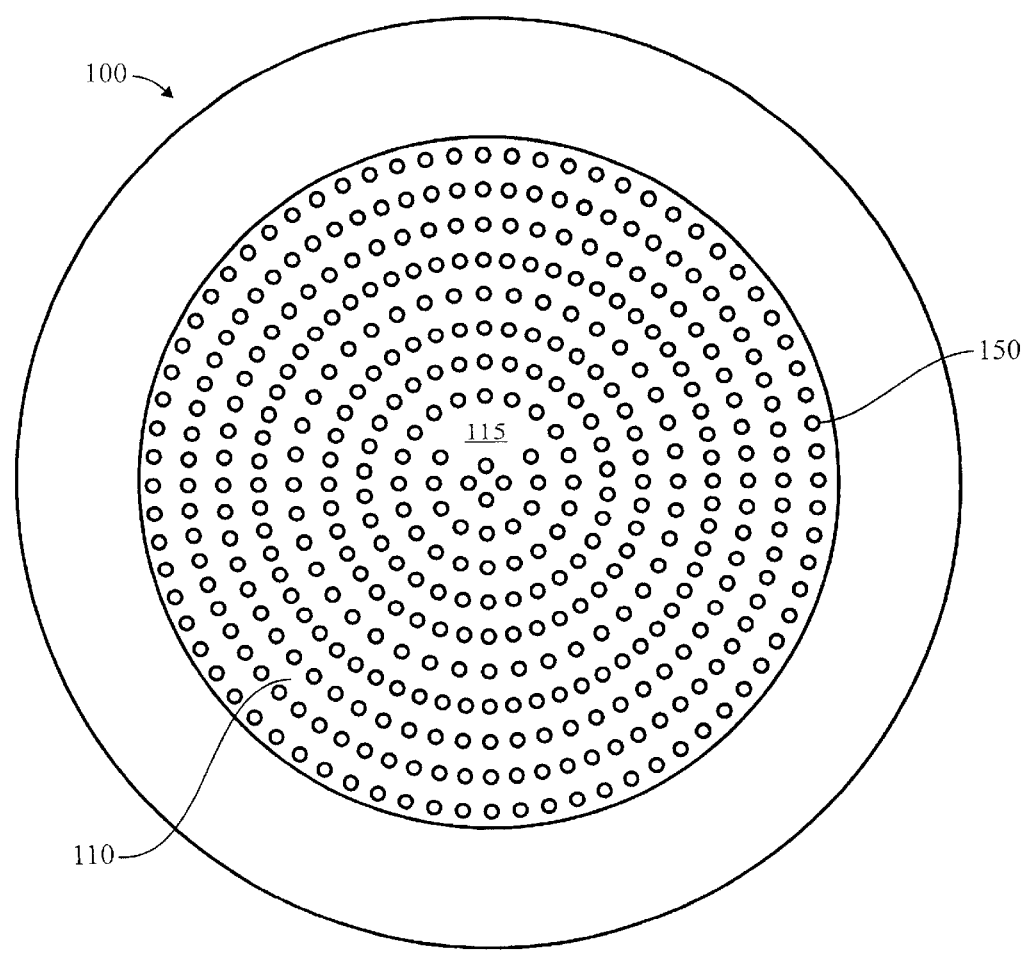
FIG. 3b is a schematic top view of the chuck of FIG. 3a showing the outlet of the conduits.

In the embodiment shown in FIGS. 3a and 3b, the chuck comprises a monopolar electrode 110 embedded in, or covered by, the dielectric member 115. The electrode 110 comprises a metal layer composed of copper, nickel, chromium, aluminum, molybdenum, or combinations thereof; that typically has a thickness of from about 1 $\mu$m to about 100 $\mu$m, and more typically from 1 $\mu$m to 50 $\mu$m. For a substrate 55 having a diameter of 200 to 300 mm (6 to 8 inches), the electrode 110 typically comprises an area of about 50 to about 250 sq. cm. In operation, a voltage applied to the monopolar electrode 110 causes electrostatic charge to accumulate in the electrode (or in the dielectric member 115 covering the electrode 110 for Johnsen-Rahbek chucks). The plasma in the chamber 50 provides electrically charged species of opposing polarity which accumulate in the substrate 55. The accumulated opposing electrostatic charges result in an attractive electrostatic force that electrostatically holds the substrate 55 to the chuck 100.

Figure 4A:
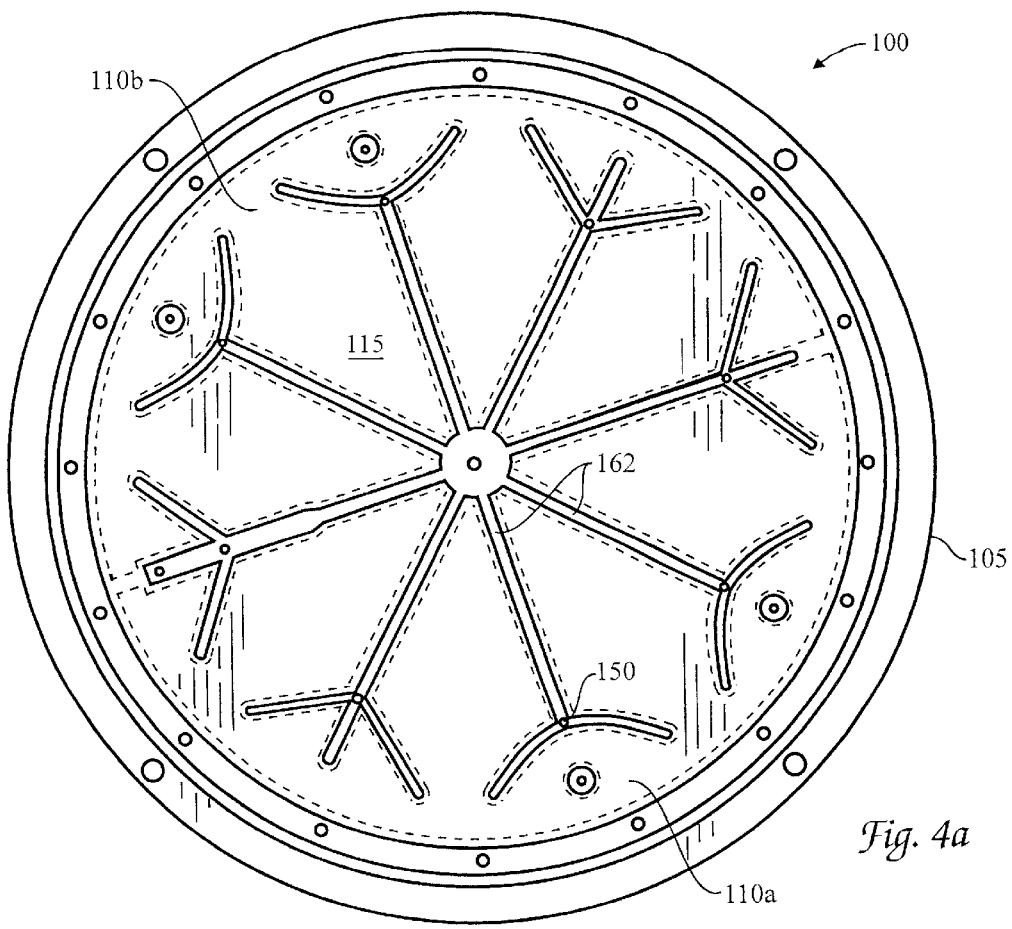
FIG. 4a is a schematic top view of an electrostatic chuck comprising gas flow conduits in grooves on the surface of the chuck.
Figure 4B:
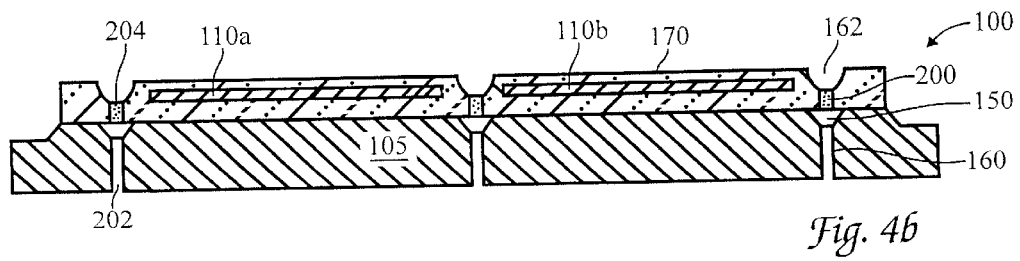
FIG. 4b is a schematic sectional side view of another version of the electrostatic chuck showing the dielectric member with gas flow conduits and electrical isolators.

Alternatively, the embedded electrode 110 can also comprise bipolar electrodes 110a, 110b, as shown in FIGS. 4a and 4b, that comprises at least two substantially coplanar electrodes that generate substantially equivalent electrostatic clamping forces. A differential electrical voltage is applied to each of the bipolar electrodes 110a, 110b to maintain the electrodes at differential electric potential to induce electrostatic charge in the substrate 55 and electrodes. The bipolar electrodes 110a, 110b can comprise two opposing semicircular electrodes 110a, 110b with an electrical isolation void therebetween that is covered by the dielectric member 115 as shown in FIG. 4a. Alternative electrode configurations 110a, 110b include inner and outer rings of electrodes, polyhedra patterned electrodes, or other segmented electrode forms embedded in the dielectric member as shown in FIG. 4b.

In the arrangement shown in FIG. 3b, the electrode comprises an electrically conductive plate 110 that is covered by a dielectric member 115 comprising a layer or coating of dielectric material. The metal plate electrode 110 is shaped and sized to correspond to the shape and size of the substrate 55 to maximize heat transfer and provide a large electrostatic holding surface for the chuck. For example, if the substrate 55 is disk shaped, a right cylindrically shaped plate is preferred. Typically, the metal plate comprises an aluminum cylinder having a diameter of about 100 mm to 225 mm, and a thickness of about 1.5 cm to 2 cm. By "electrode" 110 it is meant any of the aforementioned versions of the electrode, including both the embedded electrode layer and the metal plate electrode.

Particular aspects of the electrostatic chuck 100 of the present invention and illustrative methods of fabricating the chuck will now be described. However, the present invention should not be limited to the illustrative examples and methods of fabrication described herein. Also, it should be understood that each of the individual components, layers, and structures described herein, for example, a semiconducting dielectric layer or electrical isolator structures, can be used independently of one another and for applications other than electrostatic chucking, as would be apparent to those of ordinary skill.

Electrical Isolator in Conduit

One feature of the electrostatic chuck 100 of the present invention relates to a plurality of heat transfer gas flow conduits 150 that extend through one or more of the base 105, electrode 110, and dielectric member 115, as shown in FIGS. 2 through 4b. A gas supply channel 155 supplies heat transfer gas to the conduits 150 via a gas supply tube 160 connected to a heat transfer gas source 165. A typical gas flow conduit 150 comprises (1) an inlet 202 for receiving gas from a gas channel 155, and (2) an outlet 204 for delivering the gas to a top surface 170 of the dielectric member 115 on the chuck 100. The gas at the top surface 170 of the chuck 100 regulates the temperature of the substrate 55 by transferring heat to or from the substrate 55. The substrate 55 held on the chuck 100 covers and seals the edges of the dielectric member 115 to reduce leakage of heat transfer gas from the peripheral edge of the chuck 100. The dielectric member 115 can also comprise grooves 162 that are sized and distributed to hold heat transfer gas such that substantially the entire surface of the substrate 55 is uniformly heated or cooled, such for example a pattern of intersecting channels that cut through the dielectric member 115. Preferably, at least one conduit 150 terminates in a groove 162, and more preferably, the conduits 150 terminate at one or more intersections of the grooves 162. Alternative groove patterns are described in, for example, U.S. patent application Ser. No. 08/189,562, entitled "Electrostatic Chuck" by Shamouilian, et al., filed on Jan. 31, 1994, which is incorporated herein by reference. The gas flow conduits 150, gas supply channel 155, and grooves 162 are formed by conventional techniques, such as drilling, boring, or milling. Typically, the heat transfer gas comprises helium or argon at a pressure of about 5 to about 30 Torr.

Referring to FIGS. 3a and 4b, electrical isolators 200 are located in the outlet 204 of the gas flow conduits 150 to reduce or prevent plasma formation from the gas provided by the conduits 150. This version of the electrostatic chuck is useful for holding substrates in high density plasma environments, for example, where the electromagnetic energy coupled to the chamber is on the order of 5 to 25 watts per cm$^2$ at frequencies of 1 to 20 MHZ. High density plasmas typically contain a higher ion density of charged plasma species in thin plasma sheaths and/or plasma ions having ion energies in excess of 1,000 eV. During operation of the chuck 100, the pressure of heat transfer gas below the substrate 55 counteracts and reduces the electrostatic clamping force on the substrate 55 to form spaces or gaps at the interface. In high density plasma environments, the thin plasma sheath formed above the substrate 55 penetrates into these spaces forming an arc or glow discharge at the back of the substrate 55 which can burn holes in the substrate 55 or chuck 100. The electrical isolator structures 200 reduce or altogether prevent formation of a plasma in the spaces adjacent to the conduit 150 to significantly improve the lifetime of the chuck 100.

The electrical isolators 200 are fabricated from any dielectric material, including ceramics and thermoplastic or thermoset polymers. Suitable polymers include polyimide, polyketone, polyetherketone, polysulfone, polycarbonate, polystyrene, nylon, polyvinylchloride, polypropylene, polyethersulfone, polyethylene terephthalate, fluoroethylene propylene copolymers, and silicone. Engineering thermoplastics and thermoset resins loaded with about 35% to about 45% by volume glass or mineral fillers can be injection molded to form the electrical isolator 200. Suitable ceramic materials include $Al_2O_3$, AlN, $SiO_2$, $Si_3N_4$; of which aluminum oxide, aluminum nitride, silicon nitride, and mixtures thereof, are preferred. More preferably, the dielectric material comprises aluminum oxides which provides a degree of chemically compatibility with the aluminum of the electrode and base or a mixture of aluminum oxides and silicon oxides, as described below. The dielectric breakdown strength of the dielectric material is preferably from about 4 to 40 volts/micron, and the electrical resistance is preferably from about $10^{11}$ to $10^{20}$ Ωcm.

Preferably, the electrical isolator 200 comprises a plasma-deactivating material that is capable of deactivating, and consequently altogether preventing formation of a plasma adjacent to the gas conduits 150 below the substrate 55. The plasma-deactivating material comprises a porous, high surface area material lining the internal surfaces of the conduit 150 that prevents plasma formation by limiting the kinetic energy and/or dissipating the electrical charge of ionized gaseous species. Although the plasma deactivation mechanism is not precisely known, it is believed that the high surface area provides active recombination sites that strip the electrical charge from plasma species incident on the surface. Also, tortuous small diameter pores in the plasma deactivating material control the kinetic energy of charged plasma species in the pores by providing a small mean free path that limits acceleration, and resultant avalanche breakdown of the charged species, that is necessary to ignite a plasma. The small mean free path also results in fewer energy transferring collisions between charged gas species which further reduces plasma formation. In this manner, the porous and/or high surface area plasma-deactivating material prevents formation of a plasma in the regions below the substrate that are adjacent to the conduits 150.

The electrical isolators 200 preferably comprise continuous passages therethrough that have small linear dimensions (i.e., diameter or length) which prevent avalanche breakdown and plasma formation in the holes. Preferably, the diameter of the conduits is less than about 0.5 mm, and more preferably less than about 0.25 mm. At these dimensions, the operating pressure and power of the chamber 50 are too low to permit ionization of the heat transfer gas, thereby preventing formation of a plasma in the regions adjacent to the outlets of the gas flow conduits 50 and electrically isolating the surrounding electrode 110. The shape and distribution of the pores, volume percent porosity, pore size and distribution, and surface area of the plasma deactivating material all affect its plasma deactivating properties. Preferably, the plasma deactivating material comprises small diameter, randomly oriented, tortuous pores which, in conjunction with the spaces between the separated grains, form continuous pathways or pore passageways having small diameters extending through the material. The randomly orientated pores are desirable to produce tortuous passageways that avoid straight line pathways while providing continuous passageways that allow heat transfer gas to flow therethrough. The diameters of these pathways are typically of the same order of magnitude as the ceramic particles used to form the porous material. The tortuous pathways increase the number of effective collisions between the charged gaseous species and between the charged species and the pore wall surfaces. Preferably, the porous material comprises pore passageways that are typically sized from about 250 to about 375 μm in length, and having diameters ranging from about 1 to about 100 μm. Preferably, the volume percent porosity of the plasma deactivating material is from about 10 to about 60 volume %, and more preferably from about 30 to about 40 volume %. Most preferably, the plasma-deactivating material typically comprises a surface area per gram from about 20 $cm^2$/g to about 300 $cm^2$/g.

The plasma-deactivating material can be formed in the conduit 150 using conventional ceramic fabrication, thermal spraying. In one preferred embodiment, the plasma-deactivating material comprises a mixture of aluminum oxides and silicon oxides. The aluminum oxide grains are held together with intermixed silicon oxide glassy phase, and the resultant structure comprises continuous pathways that are formed between the ceramic grains and through its pores. The porous material can be formed by mixing the desired composition of alumina and silica, pouring the formulation in a mold shaped as the insert, and sintering the mixture at 1400° C. to melt the silica glass around the alumina. The resultant structure has a high porosity of about 5 to 50%, and tortuous pores having diameters typically ranging from 1 to about 25 microns.

In another method of fabrication, a flame spraying method is used to form the plasma-deactivating material. In this method, a high temperature flame of a combustible mixture of gases, for example, acetylene and oxygen, is formed and a ceramic powder formulation corresponding to the desired composition of the plasma deactivating material is sprayed through the hot flame. The flame spraying method provides a relatively low heat or kinetic energy input to the sprayed ceramic particles, allowing them to move relatively slowly and cool off during travel to the incident surface. The cooling and low kinetic energy impact on the conduit walls results in solidified plasm-deactivating material that comprises spherical ceramic particles which retain their shape and have extensive tortuous pathways between the particles and have high surface areas.

Electrical Isolator Structures

Figure 5A:
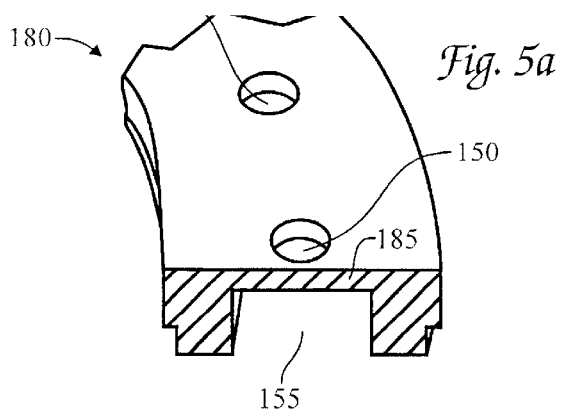
FIG. 5a is a perspective partial sectional view of an annular ring which can be used to form the gas flow channel and gas flow conduits in the chuck.
Figure 5B:
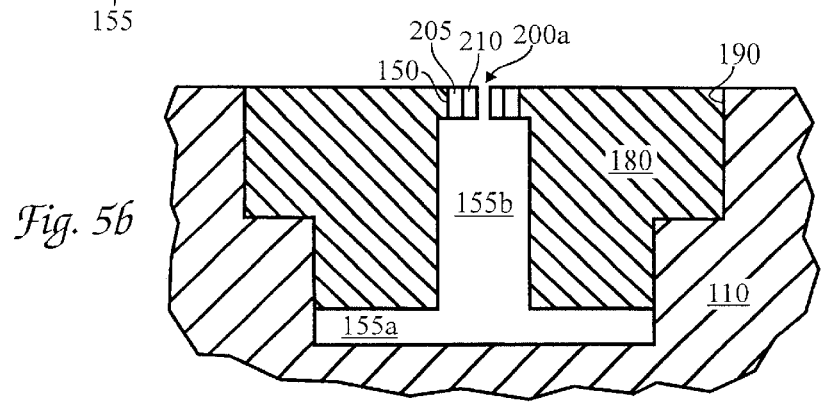

The electrical isolator 200 in the gas flow conduit 150 can have many different shapes and forms. In one embodiment that is easy to fabricate, the gas supply channel 155 with gas flow conduits 150 is machined in an annular metal ring 180 that is inserted in, and forms a portion of the electrode 110, as illustrated in FIGS. 5a to 5d. Referring to FIG. 5a, the annular ring 180 comprises a gas supply channel 155 machined in its underside in close proximity to its upper surface with a thin metal layer 185 therebetween. Conduits 150 are machined through the metal layer 185 in an annular configuration. The inlets 202 of the conduits 150 are bored through the thin layer of metal 185 prior to the application of the overlying dielectric member 115 (not shown), or the conduits can be formed after the application of dielectric member by simultaneously boring outlet holes 204 through the dielectric member 115 and thin metallic layer 185. The annular ring 180 is sized to fit along the periphery of the electrostatic chuck 100, and is sealed at edges and surfaces 190 adjacent to the central portion of the electrode 110 to reduce leakage of heat transfer gas. Preferably, as shown in FIG. 5b, the annular ring 180 and electrode 110 form a first annular gas flow channel 155a and an overlying and concentric second annular channel 155b having a larger width. The annular ring 180, including a plurality of predrilled conduits 150 spaced apart around the length of the annular ring, is fitted into this combination of channels. The dielectric member 115 (not shown) is applied over the surface of the ring 180 and processed to the desired thickness. Thereafter, an opening is drilled through the dielectric member 115 to connect to the conduit 150 to allow heat transfer gas to flow from channel 155 to the surface of the electrostatic chuck.

In the version shown in FIG. 5b, the electrical isolator 200a in the gas flow conduit 150 comprises a plurality of dielectric coatings 205, 210 covering the sidewalls of the conduit. The dielectric coatings 205, 210 can be deposited directly on sidewalls of the conduits formed in a annular ring 180 (as shown) or can be deposited on top of another "sidewall" dielectric coating that is initially deposited on the sidewalls of the conduit 150. For example, the first or inner sidewall dielectric coating 210 can comprise a highly electrically insulative layer, and the outer coating 205 can comprise a coating of porous plasma deactivating material.

Figure 5C:
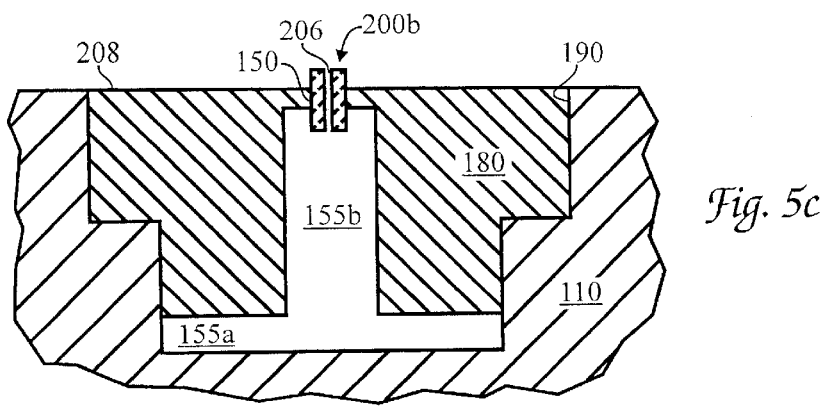

FIG. 5c illustrates another embodiment in which the electrical isolator comprises a preformed dielectric insert 200b inserted in the conduit 150 and having at least one continuous hole or passageway 206 that allows heat transfer or other gas to flow through the conduit 150. The dimensions of the hole are selected to reduce plasma formation, and preferably comprise a diameter equal to or less than about 0.4 mm. The preformed dielectric insert 200b can be fabricated from electrical insulator or dielectric material, plasma-deactivating material, or mixtures thereof. In general, the dielectric inserts 200b are fabricated by positioning the insert into the conduit 150 drilled in an annular ring 180 with an apex of the insert extending from the electrode 110. A layer of dielectric (not shown) is formed over the surface 208 of the annular ring 180 and electrode 110 and processed to the desired thickness to expose the hole 206 of the insert 200b. Thereafter, the apex is removed, for example, by grinding or ablating; or a dielectric member 115 is formed around the apex to hold the dielectric insert 200b in position. Dielectric insert 200b electrical isolates the annular ring 180 from process plasma which may penetrate the outlet of gas flow conduit 150 and reduces arcing between the substrate 55 supported upon the surface of the electrostatic chuck 100 and the electrically conductive annular ring 180.

Figure 5D:
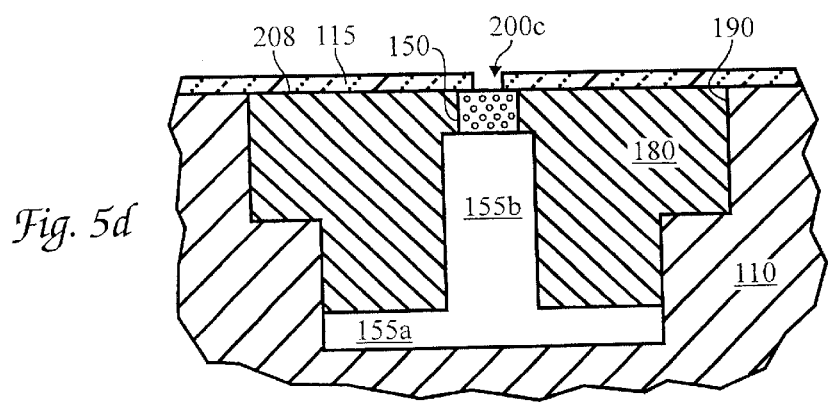

FIG. 5d illustrates yet another embodiment of the present invention where the electrical isolator comprises a plug 200c of dielectric material that substantially fills up the outlet of the gas flow conduit 150. The plug 200c comprises continuous pathways such as interconnected pore passageways, microcracks, and separated grain boundary regions that extend through the entire plug. Suitable plugs 200c have porosities ranging from about 10 to about 60 volume %. In this embodiment, an overlying dielectric member 115 covers the plug 200c to hold the plug in place, and an opening is drilled through the dielectric member and stopped on the top surface of the porous plug 200c. The continuous pore pathways formed by the intersection of one or more pores, microcracks, and separated grain boundary regions in the porous plug 200c allow heat transfer gas to flow therethrough, while reducing or preventing limiting plasma formation in the conduit 150.

Figure 6:
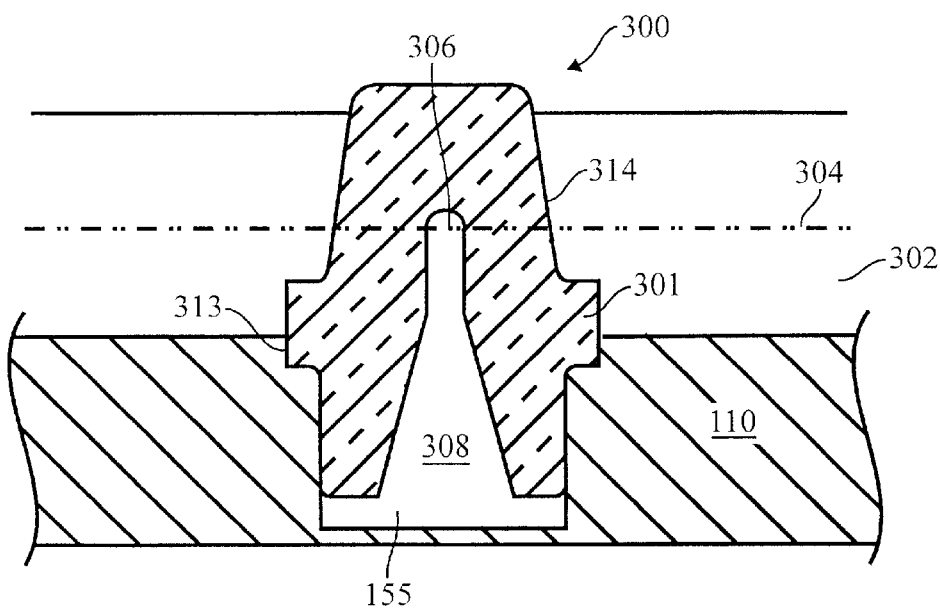
FIGS. 6 and 7 are schematic side views showing fabrication of electrical isolators that comprise dielectric inserts fitted in the gas flow conduits.

Another version of the electrical isolator, as shown in FIG. 6, comprises a cylindrical dielectric insert 300 having a boss 301 around its circumference and a vertically extending cavity 308 extending from the bottom and having a closed off apex 306. The dielectric insert 300 is conically shaped with tapering sides 314 at an angle of about 26°. The central portion is cylindrical with a diameter of about 1.5 mm (60 mils), and the entire insert has a diameter of about 3.2 mm (127 mils). A socket hole 313 is bored in the electrode 110 to connect to the underlying gas supply channel 155 in the electrode 110. Dielectric insert 300 is fitted into the socket hole 313 with the bottom of its boss 301 resting on the side portions of socket hole 313, leaving a clearance between the bottom of dielectric insert 300 and the gas supply channel 155. Heat transfer gas flows from the gas supply channel 155 into the vertically extending cavity 308 formed within dielectric insert 300. After the dielectric insert 300 is fit into socket hole 313 of electrode 110, a dielectric member 302 is formed over the surfaces of both the dielectric insert 300 and electrode 110. Thereafter, the dielectric member 302 is ground back to line 304 which is below the closed end of the cavity 308 of the insert 300, to expose cavity 308 at its apex 306 allowing heat transfer gas to flow therethrough. Preferably, a plurality of dielectric inserts 300 are inserted into respective socket holes 313 spaced apart along the electrode 110, or into socket holes formed in the annular ring 180 which is thereafter joined to the electrode 110.

Figure 7:
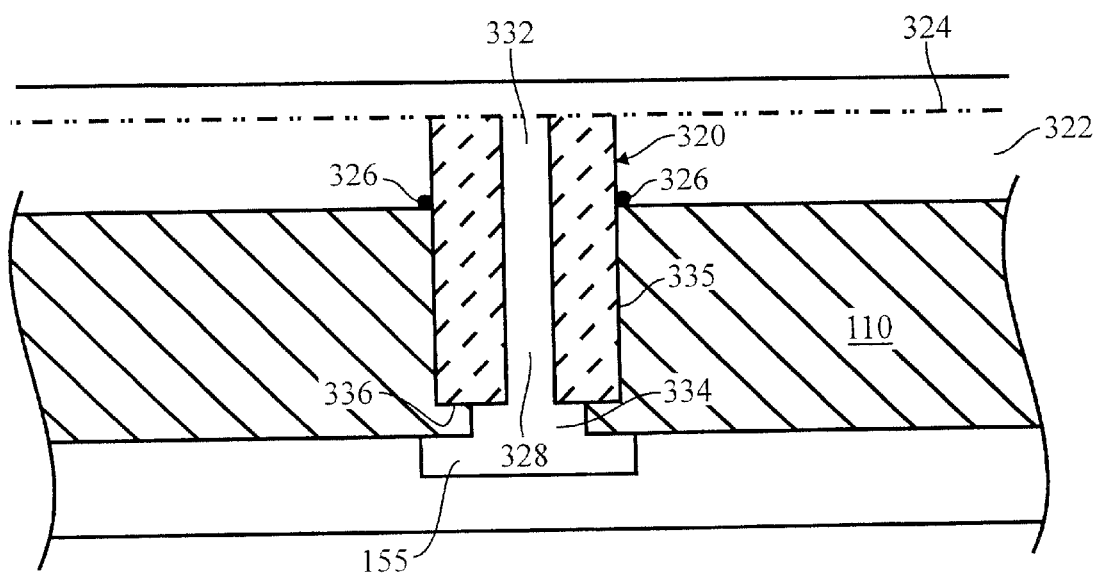

FIG. 7 shows another embodiment of the electrical isolator comprising a tubular sleeve 320 shaped as a right circular cylinder with an axial opening 328 therethrough. The axial opening 328 passes through the entire sleeve 320 (or has an upper closed end, not shown). The tubular sleeve 320 is inserted in corresponding socket holes 334 in the electrode 110 that connects to the underlying gas supply channel 155 of the chuck 100. A second socket hole 335 is drilled partially through electrode 110 to form an annular ledge 336 at the bottom of the socket hole 335 that supports the tubular sleeve 320. Optionally, a tubular sleeve 320 is held in the electrode 110 by an annular weld or brazed joint 326 extending around the sleeve 320 at the top of the electrode 110 or by an interference fit. After the tubular sleeve 320 is fitted into socket hole 335, a dielectric member 322 is formed over the surface of insert sleeve 320, and thereafter ground back to line 324 to expose the opening 332 of the sleeve 320. Instead of welding sleeve 320 in place, layer 322 can be processed so that it leaves dielectric insert 320 unexposed. Openings 332 are then drilled through semiconducting dielectric member 322 to connect with opening 328 in dielectric insert sleeve 320. Preferably, a plurality of such tubular sleeves 320 are positioned around the electrode 110.

FIGS. 8a to 8f show additional embodiments of the electrical isolators 200 of the present invention. The overlying dielectric member 115 which forms the upper surface of the electrostatic chuck 100 is not shown so that the underlying structures can be shown with more clarity. The dielectric insert 510 illustrated in FIG. 8a comprises a plurality of openings 516 leading to gas flow channel 155. Dielectric insert 510 is shaped to fit into annular ring 180 and comprises a dome-shaped upper surface that, after application of an overlying dielectric member (not shown), can be ground or ablated to expose the openings 516 of the dielectric insert 510 while leaving a portion of the upper surface of the electrode 110 and the insert covered by the overlying dielectric member.

Figure 8A:
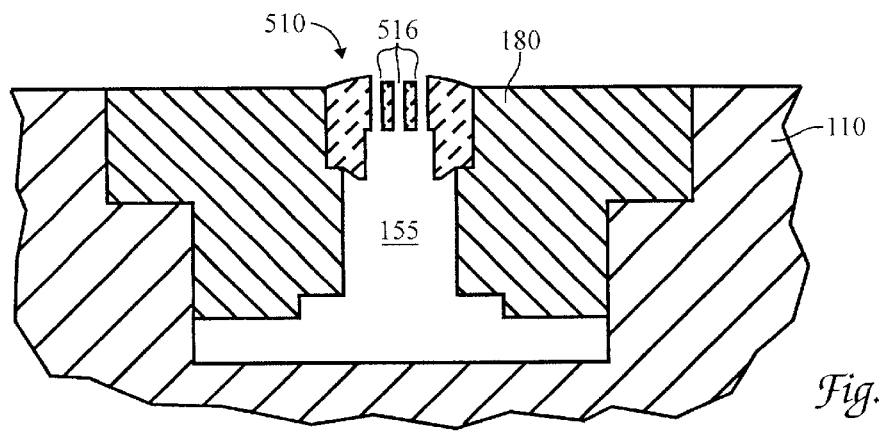
FIG. 8a is a schematic side view showing a dielectric insert having multiple openings in a gas flow conduit.
Figure 8B:
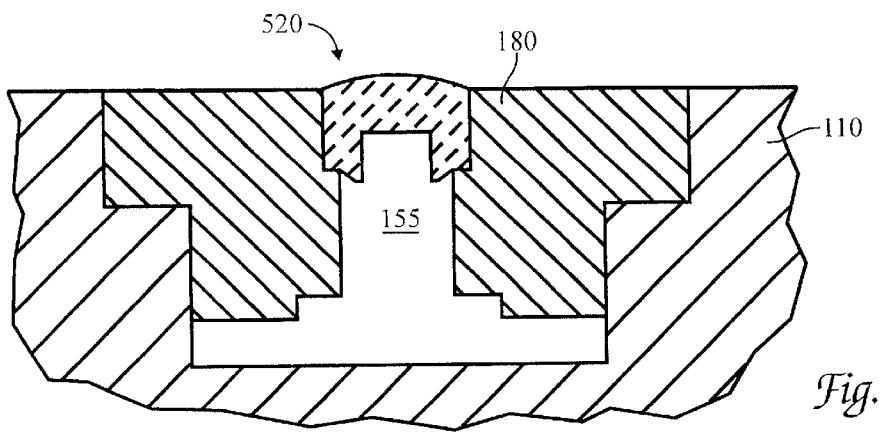
FIG. 8b is a schematic side view showing a dielectric insert made of a porous material in a gas flow conduit.
Figure 8C:
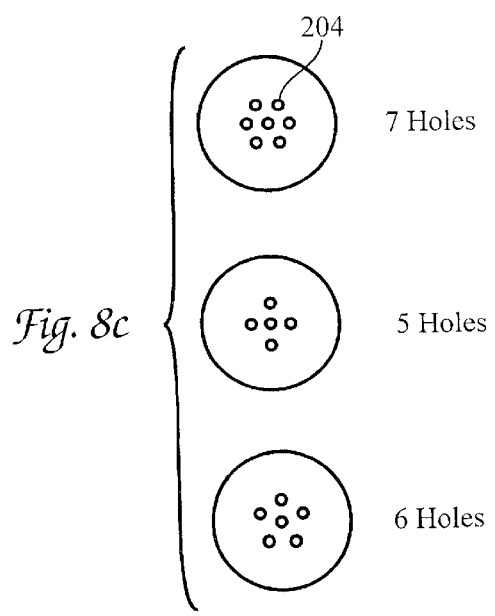
FIG. 8c illustrates three hole patterns that can be used in the dielectric inserts of FIGS. 8a and 8b.

The electrical isolator of FIG. 8b also comprises a dielectric insert 520 that uses an overlying dielectric layer (not shown) to hold it in place. The overlying dielectric layer (which serves as the dielectric member 115) is applied over the surface of insert 520, annular ring 180, and electrode 110; and thereafter, ground or ablated to the desired thickness. The conduits through the overlying dielectric layer and dielectric insert 520 are drilled through the overlying dielectric layer and insert 520 to connect to gas flow channel 155. FIG. 8c shows typical hole patterns which can be drilled through the dielectric inserts 510, 520 of FIGS. 8a and 8b, respectively. Alternatively, the dielectric inserts 510, 520 can be fabricated from porous material without drilling holes therethrough, allowing the continuous pores and passageways of the insert to allow heat transfer gas to flow therethrough.

In the embodiment shown in FIG. 8c, the conduits or grooves are formed in the electrical isolator 200 by laser micro-machining, a grinding wheel, or diamond/cubic boron nitride drilling. A preferred laser is an excimer UV laser having a short wavelength and high energy that is operated at a relatively low power level to reduce redeposition of drilled aluminum particles onto the walls of the openings and onto the dielectric member. Such aluminum contamination can cause arcing of the dielectric member 115. The number of outlet openings 204 for the conduit depends on the heat transfer load and the gas flow rate required to handle this load. For an electrostatic chuck 100 used with an 200 mm (8 inch) silicon wafer, a suitable number of outlets 204 or openings for the gas flow conduits range from about 12 to about 24, and the openings are positioned in a ring-shaped configuration around the perimeter of the electrostatic chuck 100. Preferably, the diameters of the outlets 204 are less than or equal to about 0.20 mm, and more preferably about 0.175 mm.

Figure 8D:
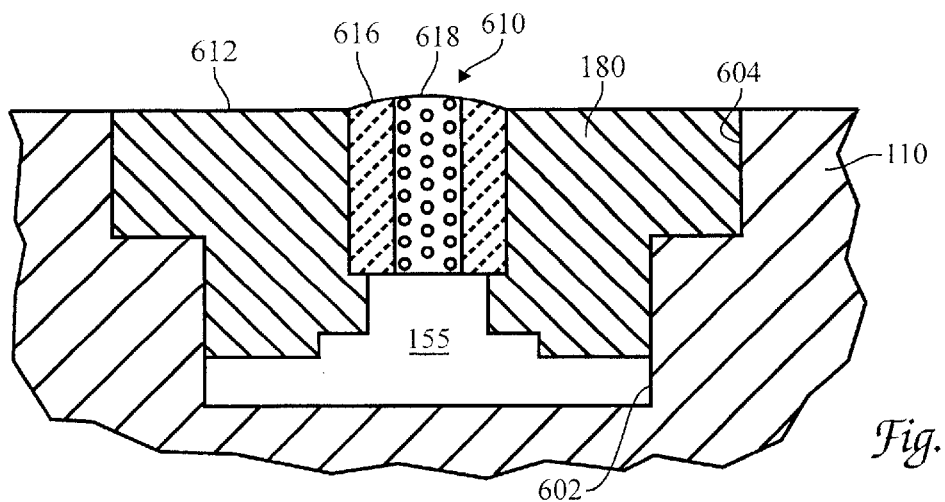
FIG. 8d is a schematic side view of a composite dielectric insert comprising a non-porous dielectric sleeve surrounding a porous dielectric center.
Figure 8E:
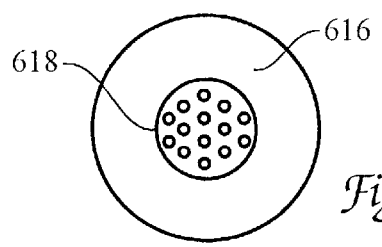
FIG. 8e is a top view of the composite dielectric insert of FIG. 8d.
Figure 8F:
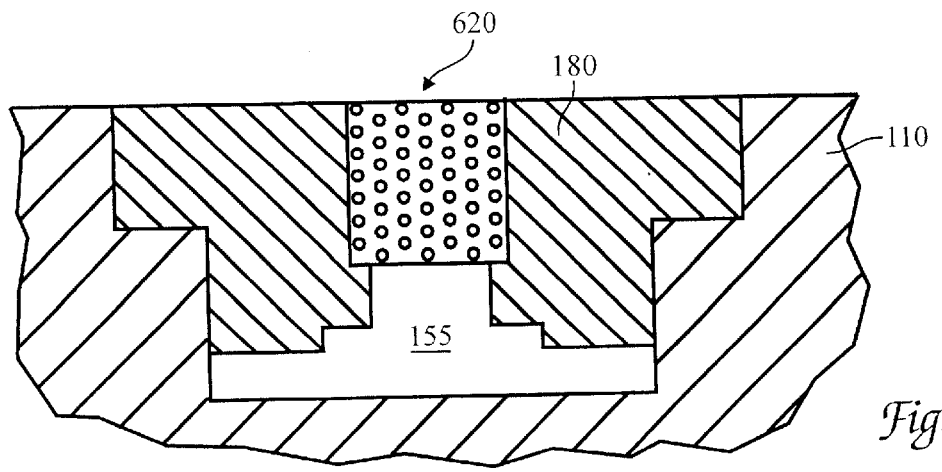
FIG. 8f is a schematic side view of a porous dielectric insert positioned in a gas flow conduit.

Another series of dielectric insert designs, shown in FIGS. 8d through 8f, are positioned in the annular ring 180 fitted in an electrode 110 having two annular trenches 602, 604 therein. In FIG. 8d, the dielectric insert 610 comprises a tubular non-porous dielectric sleeve 616 surrounding a porous dielectric insert 618. The dome-shaped upper portion of dielectric insert 610 allows the dielectric member 115 (not shown) to hold it in place. The overlying dielectric member 115 is ground or ablated to expose porous dielectric insert 618, as shown in the top view of FIG. 8e. This allows heat transfer gas to flow through channel 155 and porous dielectric insert 618 to the surface of the dielectric member. The non-porous dielectric sleeve 616 is shaped to form a small angle with the adjacent surface 612 of the annular ring 180, allowing deposition of a contiguous coating without voids or cavities at the interface of the sleeve 616 and ring 180. The upper surface of dielectric insert 616 is roughened to provide a strong bond with the dielectric member 115. Preferably, dielectric sleeve 616 has greater tensile strength and modulus than the insert 618 to provide a more reliable joint between sleeve 616 and annular ring 180. This also reduces formation of voids between dielectric sleeve 616 and ring 180 which can cause flaws in the overlying dielectric coating (not shown). FIG. 8f illustrates another dielectric insert 620 that entirely comprises a porous dielectric material, such as the plasma-deactivating material having continuous pore passageways therein. The porosity and pore size distribution of the porous material is selected to reduce formation of plasma in and adjacent to the dielectric insert 620.

Figure 9A:
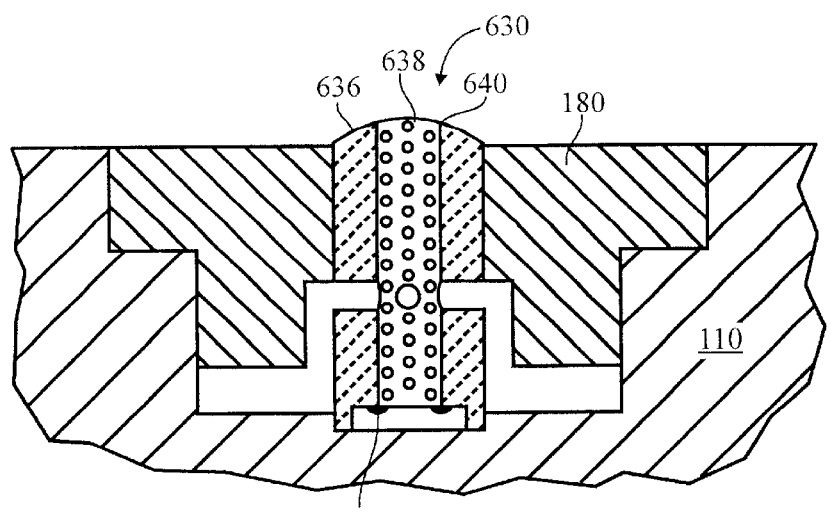
FIG. 9a is a schematic side view of a composite electrical isolator comprising a non-porous dielectric sleeve surrounding a porous dielectric center, with an annular gas flow opening therebetween.

FIG. 9a shows yet another preferred configuration of a dielectric insert 630 comprising a dielectric sleeve 636 and a dielectric center plug 638. An annular ring shaped opening 640 is between sleeve 636 and center plug 638. Center plug 638 is held in place by an adhesive or ceramic bonding material such as fusible glass ceramic 642, which anchors plug 638 to sleeve 636. By adjusting the size of dielectric center plug 638, the gas flow rate through dielectric insert 630 is adjusted. Again, an overlying dielectric member 115 (not shown) is applied over the surfaces of the electrode 110, annular ring 180, and dielectric insert 630. Subsequently the overlying dielectric member 115 is processed to expose the opening 640 in dielectric insert 630 while leaving at least a portion of sleeve 636 entrapped below the overlying dielectric member.

Figure 9B:
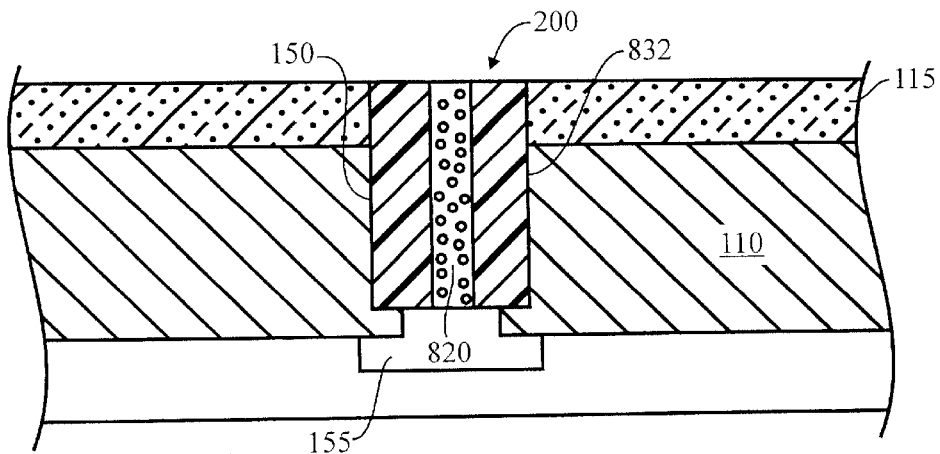
FIG. 9b is a schematic side view of a composite electrical isolator comprising a ceramic core and a polymer sleeve.

FIG. 9b shows a preformed electrical isolator 200 comprising a porous plug 820 in a polymer sleeve 832, the sleeve sized to hold the porous plug 820 in the conduit 150 in the dielectric member 115 or electrode 110. Preferably, the sleeve 832 is made of a ductile, lubricative, and slippery surfaced polymeric material, such as Teflon® (trademark of DuPont Company) which is a tetrafluoroethylene polymer, or a silicone containing material. Because of its ductility and lubricative surface, the sleeve 832 facilitates insertion of the hard, brittle, and fracture-prone ceramic porous plug 820 into the conduits 150 of the chuck. Also, the ductile and flexible polymer conforms its shape to fit snugly into the conduit, to eliminate the need for machining the conduit and/or the porous plug to precise tolerances. In the fabrication process, the porous plug 820 is first press fitted into the polymer sleeve 832, and the assembled electrical isolator 200 is then press fitted into the outlet 204 of the conduit 150. The preformed insert in the sleeve 832 defines at least one continuous passageway that allows gas to flow through the insert. While the ceramic insert can be fabricated from aluminum oxide, aluminum nitride, silicon dioxide, zirconium oxide, silicon carbide, silicon nitride, or mixtures thereof; of which aluminum oxide, aluminum nitride, or silicon nitride, are preferred.

Figure 9C:
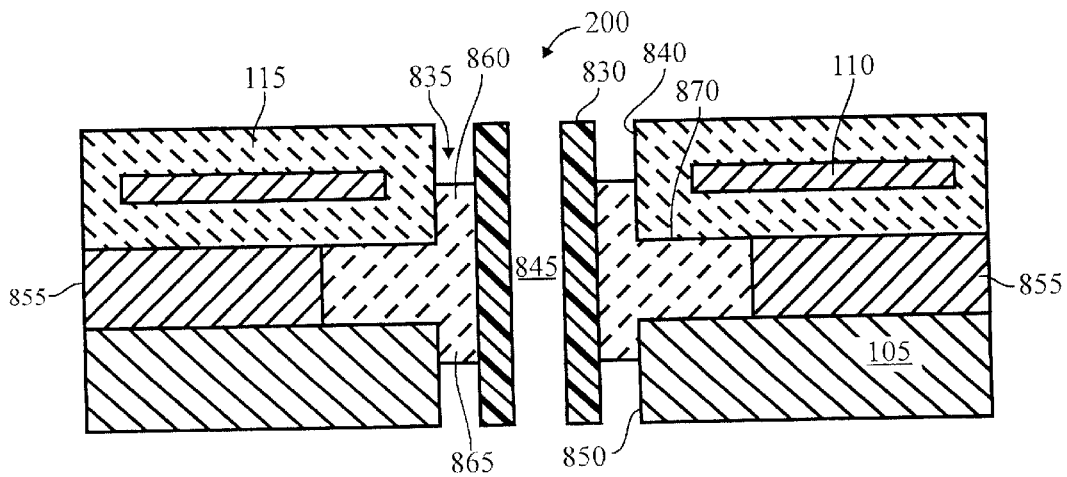
FIG. 9c is a schematic side view of a composite electrical isolator comprising a tubular insert and an outwardly extending spacer ledge.

In the embodiment shown in FIG. 9c, the electrical isolator 200 comprises an outwardly extending spacer 835 that is sized to hold an insert 830 in conduits 840, 850. Preferably, the spacer 835 is made of a ceramic or plastic material, such as Teflon® (trademark of DuPont Company). The spacer 835 has a top tubular portion 860 and a bottom tubular portion 865 separated by a central ledge 870 having a cross-sectional area greater than the inner diameter of conduits 840, 850. The spacer 835 aligns and holds in place the tubular insert 830 during assembly of the chuck, and prevents ingress of bonding material 855, such as molten solder, for example indium, into the conduits 840, 850 during bonding of the chuck 100 to a base 105. Prior to joining the chuck 100 to the base 105 the top tubular portion 860 is inserted into conduit 840 on the lower surface of the chuck and the bottom tubular portion 865 is then aligned with and inserted into conduit 850 in the base. The base/chuck assembly is placed into a mold, which is then evacuated by a vacuum pump and into which molten solder is injected. The thickness of the central ledge 870 of a plurality of spacers 835 interposed between the chuck 100 and the base 105 hold the chuck at a predetermined distance from the metal base to provides a uniform bond line of predetermined thickness. A uniform bond line provides uniform thermal resistance which in turn promotes good heat transfer between the base 105 and the chuck 100. This is particularly advantageous in the embodiment in which the base 105 advantageously comprises heat transfer fluid channels 90 that are used to circulate heat transfer fluid to heat or cool the chuck 100 to regulate the temperature of the substrate 55. As shown in FIG. 2, the base 105 comprises channels 90 through which heat transfer fluid can be circulated by fluid circulator 88 to heat or cool the chuck 100 as needed to maintain substrate temperature.

Figure 10A:
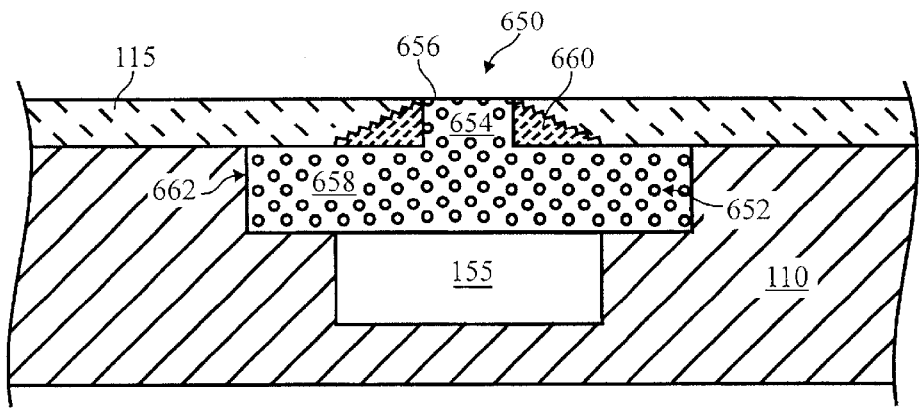
FIG. 10a is a schematic side view of a composite electrical isolator comprising a tapered non-porous dielectric sleeve surrounding a porous dielectric center.

Yet another embodiment of a composite dielectric insert is shown in FIG. 10a. In this embodiment, the dielectric insert 650 comprises a porous dielectric material shaped in the form of an inverted T-shape structure, and having a boss 652 around its circumference, the boss comprising a vertical cylinder 654 with a closed upper end 656 centered on a disc portion 658. The vertical cylinder 654 of the boss 652 typically has a diameter of about 1 to about 3 mm and the disc portion 658 a diameter of about 3 to about 5 mm. A non-porous sleeve 660 is shaped to fit and surround the vertical cylinder 654. The tapered upper surface of the non-porous sleeve 660 is roughened to allow strong adherence to the overlying dielectric member 115. To fabricate the chuck, a socket hole 662 is bored in the electrode 110 to connect to the underlying gas supply channel 155 in the electrode 110. Dielectric insert 650 is fitted into the socket hole 662 with the bottom of its boss 652 resting on the bottom portions of socket hole 662, exposing the relatively wide area of the disc 658 to allow heat transfer gas to ingress into the insert 650 from the gas supply channel 155, and thereafter flow into the vertically extending cylinder 654. After the insert 650 is fit into socket hole 662 of electrode 110, a dielectric member 115 is formed over the surfaces of the sleeve 650, the tapered roughened surface of the sleeve 660, and adjacent surfaces of the electrode 110. Thereafter, the dielectric member 115 is ground back to exposed the closed end of the cylinder 654, and the porous pathways therein allow heat transfer gas to flow through.

Figure 10B:
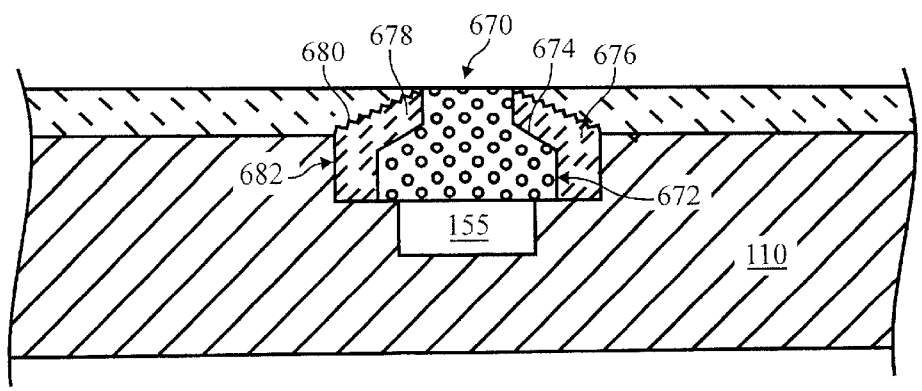
FIG. 10b is a schematic side view of another version of a composite electric isolator.

In the embodiment shown in FIG. 10b, the dielectric insert 670 comprises a boss 672 having conically shaped tapering sides at 674 at an angle of about 26°. In this version, a non-porous sleeve 676 comprising a tubular shape with an inwardly extending cap 678 is shaped and sized to fit over the dielectric insert 670. The upper surfaces 680 of the nonporous sleeve 676 are roughened to form a surface having a strong mechanical adherence. Glass or ceramic cement can be used to bond the cap 678 of the nonporous insert onto the boss 672 of the porous insert. Thereafter, the composite insert is positioned in a corresponding hole 682 in the electrode 110, and the dielectric member 115 is formed over the insert and thereafter ablated or ground to expose the surface of the porous insert, as described above.

Figure 11:
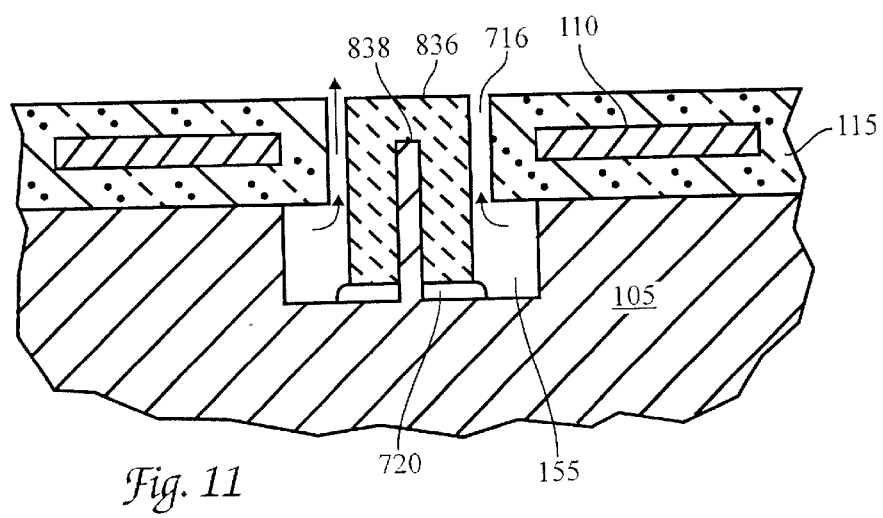
FIG. 11 is a schematic side view of an electrical isolator comprising an embedded electrical lead.

In the embodiment shown in FIG. 11, the electrical isolator 200 comprises a dielectric material shaped in the form of a column or pin 836 having an embedded electrical conductor lead 838 that is electrically connected to the grounded base 105 of the chuck. The lead 838 is electrically connected to the base that is typically maintained at an electrical ground, to bring the ground potential applied to the base closer to the substrate to suppress the formation of plasma and electrical arcing in the conduit 150. Each gas supply channel 155 of the chuck contains a centrally positioned dielectric pin 836 having a diameter sized smaller than the conduit to provide an annular or circumferential opening that allows gas to flow from the channel 155 past the dielectric pin 836 and below the substrate. The dielectric pin 836 is held in place in channel 155 by an adhesive or bonding material 720 applied to the base of the pin.

Figure 12A:
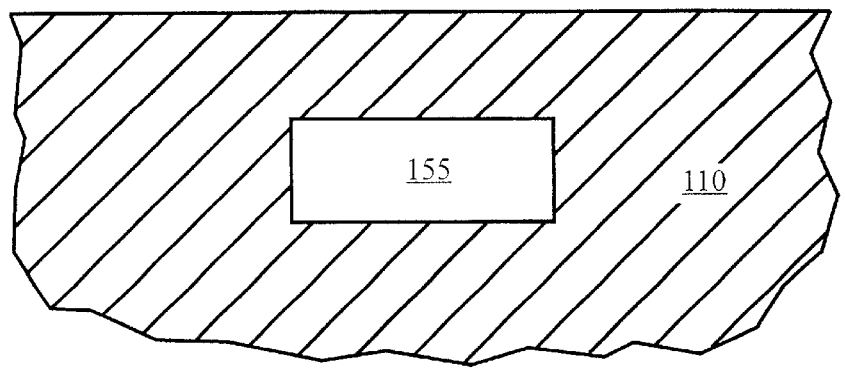
FIGS. 12a through 12f illustrate a method of forming an electrical isolator in a gas flow conduit.
Figure 12B:
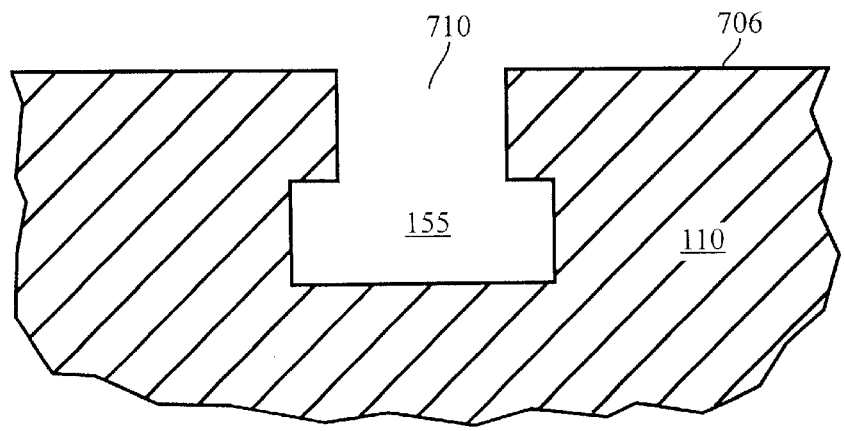
Figure 12C:
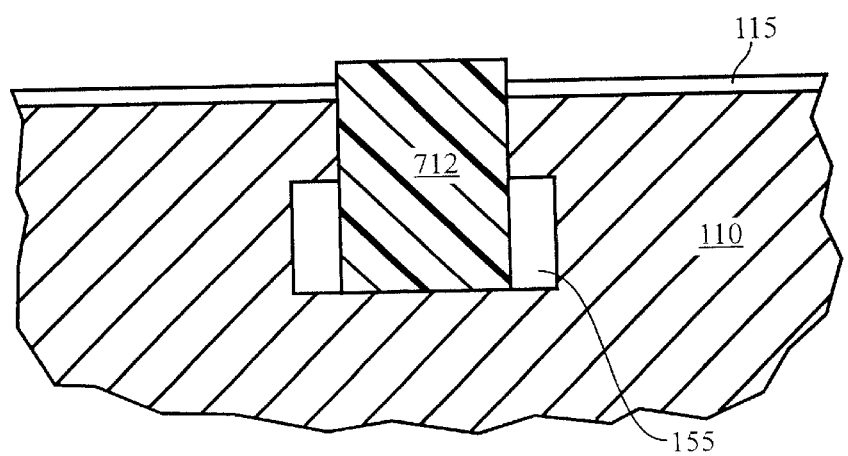
Figure 12D:
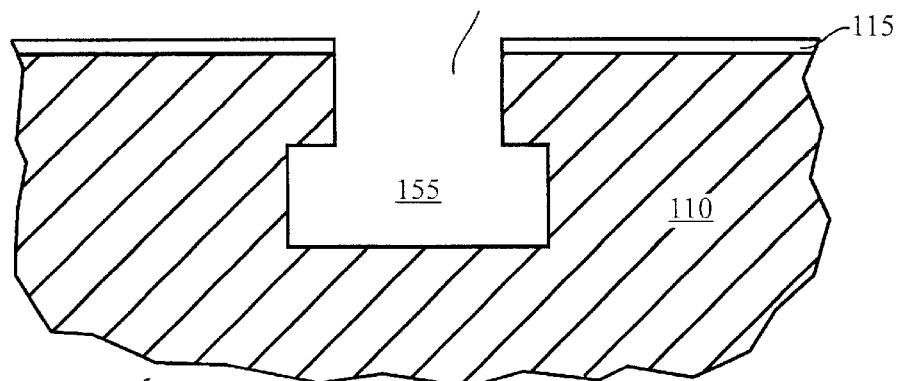
Figure 12E:
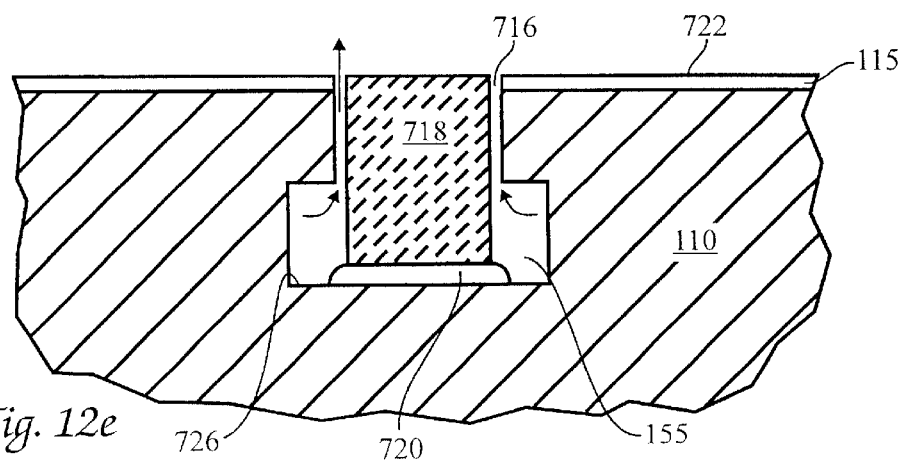
Figure 12F:
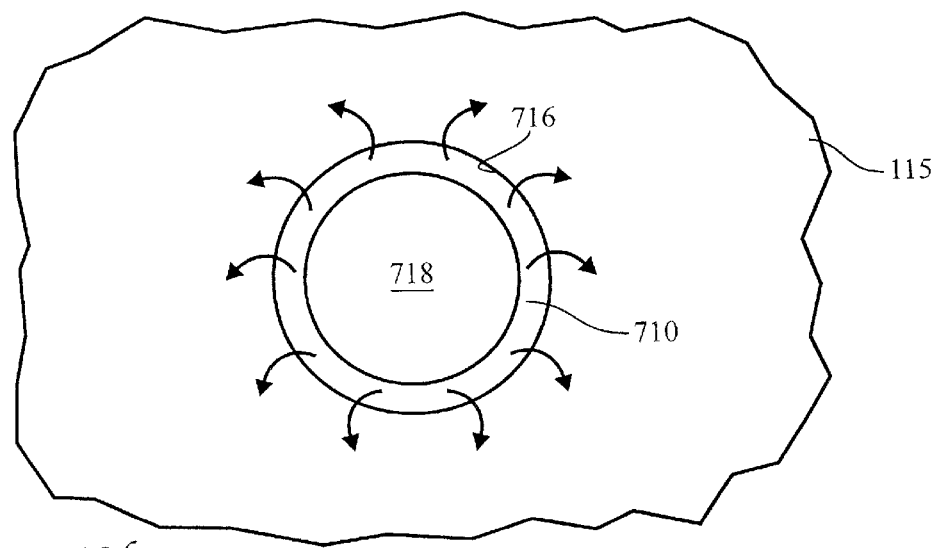

FIGS. 12a through 12f illustrate a preferred embodiment of the present invention which provides ease in fabrication. Referring to FIG. 12e, the final structure comprises an electrode 110 including at least one gas supply channel 155 which contains dielectric insert 718. Dielectric insert 718 is sized to provide an annular opening 716 that allows gas to flow from the channel 155 and past the dielectric insert 718, as shown in FIG. 12f. The dielectric member 115 overlying electrode 110 also includes at least one opening directly over channel 155, the opening sized to allow insertion of dielectric insert 718 with the annular opening 716 around the insert 718. Thus, heat transfer gas can flow from channel 155 to the surface of the dielectric member 115 via the annular opening 716. Dielectric insert 718 is held in place in channel 155 by an adhesive or bonding material 720. It is not critical that dielectric insert 718 be centered in the opening 710 through the dielectric member 115, as long as the heat transfer gas can flow through the annular opening 716.

Fabrication of this embodiment, is shown in FIGS. 12a through 12f. FIG. 12a shows a gas supply channel 155 formed in the electrode 110, and at least one hole or opening 710 is drilled through the surface 706 of the electrode 110 to connect with heat transfer gas flow channel 155, as shown in FIG. 12b. The diameter of opening 710 is generally, but not by way of limitation, about 2 mm (0.080 inches) or larger. Although this diameter is not critical, the tolerance of the selected diameter should be held within about ±0.13 mm (±0.005 inches). As shown in FIG. 12c, a space-holding masking pin 712 is then held in opening 710 and channel 155 so that overlying dielectric member 115 can be formed without excessive dielectric material entering into opening 710. This is the reason the tolerance of the diameter of opening 710 should be carefully controlled. Masking pin 712 is preferably constructed from a material which does not adhere to the dielectric member 115, such as a Teflon® (trademark of DuPont Company) masking pin 712. Space-holding masking pin 712 is generally 3 to 6 diameters high; being sufficiently tall to allow pulling out the pin 712 after forming the dielectric member 115, and sufficiently small to reduce shadowing of the dielectric member 115 around masking pin 712.

The dielectric member 115 is typically applied to a thickness which is from about 250 to about 600 microns (10 to 20 mils) greater than the desired final thickness; and after application of dielectric member 115 and removal of masking pin 712, as shown in FIG. 12d, the dielectric member 115 is ground to final thickness, and cleaned of grinding residue. This provides a smooth, flush surface 722 to the dielectric member 115, which is flat to at least 25 microns, i.e., all points on the surface lie within two parallel planes spaced 25 microns apart. Annular opening 716 typically has a diameter of about 2 mm (0.08 inches) or more to permit removal of surface residue, such as the grinding residue. This is an advantage over other embodiments of this invention which have smaller diameter openings and are more difficult to clean.

A measured quantity of adhesive or bonding ceramic 720 is then deposited at the base of channel 155, directly beneath opening 710. The thickness of adhesive layer 720 is sufficient to compensate in variations in the length of dielectric pin 718 while maintaining the smoothness of the chuck surface across the dielectric member 115 and dielectric pin 718. Dielectric pins 718 are typically fabricated from ground ceramic, such as alumina, and have a diameter ranging from about 0.76 mm to about 0.102 mm (0.003 to 0.005 inches) less than the bore diameter of opening 710. Typically, the dielectric pins 718 are cut at least ¼ mm (0.010 inch) shorter than the bore depth through dielectric member 115 and electrode 110 to the bottom 726 of channel 155. Dielectric pins 718 may be cut as much as 1 mm (0.040 inch) undersized in length.

Dielectric pins 718 are inserted through opening 710 and into adhesive 720 resting on the bottom 726 of channel 155. It is important that the pins 718 are positioned to provide a flush top surface 724, and this is accomplished using the depth of penetration of pins 718 into the thickness of adhesive 720 to make up any differences in length of pins 718. It is not critical that dielectric pins 718 be centered within the bore openings 716 and 710, and variation is allowable, as apparent from FIG. 12f. The heat transfer gas flows out of the annular opening 716 between dielectric pin 718 and electrode 110. In an alternative method, the dielectric pin is held in place by an opening machined into the bottom surface 726 into which dielectric pin 718 is interference fitted or staked.

For electrostatic chucks 100 used to hold 8-inch diameter semiconductor wafers, approximately 12 to 24 conduits having dielectric inserts 718 are positioned in a ring around the periphery of the chuck 100. The circular opening 710 in electrode 110 (or annular ring 180) typically ranges from about 1 to about 10 mm (0.040 to about 0.400 inches) in diameter, and the dielectric insert has an outer diameter of approximately 0.123 mm (0.005 inches) smaller than the diameter of the cavity. These dimensions are adjusted depending on the kind of heat transfer gas used, the pressure in the process chamber, and the desired gas flow rate to the surface of the electrostatic chuck 100.

Where the electrical isolator 200 is in close contact with an opening in the electrode 110 or annular ring 180, a close contact can be achieved using an interference fit or press fit. During press fitting of the dielectric insert 200b in the opening, a uniform pressure should be applied to the surface of the dielectric insert to prevent fracture of the brittle insert using a tool designed to fit and apply even pressure to the surface of the dielectric insert during press fitting. In general, electrical isolators 200 comprising ceramic dielectric inserts should be small in size, about 0.5 mm (0.020 inches) to about 10 mm (0.400 inches) in diameter, to avoid mechanical failure from compressive loads applied as a result of temperature cycling during substrate processing. The incompatibility of the thermal coefficient of expansion between the ceramic dielectric and the electrode 110 of the electrostatic chuck 100 creates these compressive loads during temperature cycles. The small size of the dielectric insert also makes it possible to compression fit the insert into the electrostatic chuck 100 in an interference fit. Also, the insert should be tapered toward its bottom edge to permit easier insertion into the receiving cavity. Since alumina containing dielectric inserts have relatively hard and sharp edges, the insert can be pressed into the underlying aluminum cavity with sufficient pressure to cut into the aluminum and provide a close press fit. A close press fit is also obtained by deforming the conductive material in contact with the dielectric insert (staking). The dielectric insert can also be closely fitted using a machined interference fit of about at least about 0.025 mm (0.001 inch). Also, a large interference fit between the insert and surrounding base increases the strength of the bond of the overlying dielectric coating applied on the base and insert, reducing thermal expansion microcracking of the overlying dielectric member, which can lead to penetration of high density plasmas, and rapid breakdown of the dielectric member overlying the insert and base.

Figure 13A:
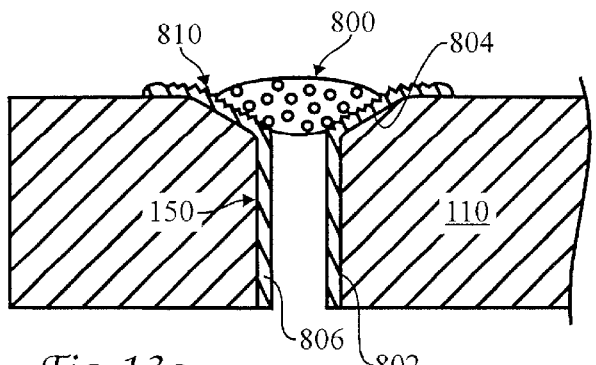
FIGS. 13a through 13c are schematic sectional side views showing fabrication of an electrical isolator comprising a tapered porous plug in a gas flow conduit.
Figure 13B:
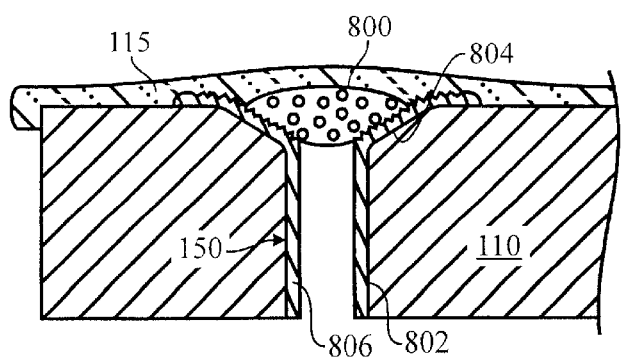
Figure 13C:
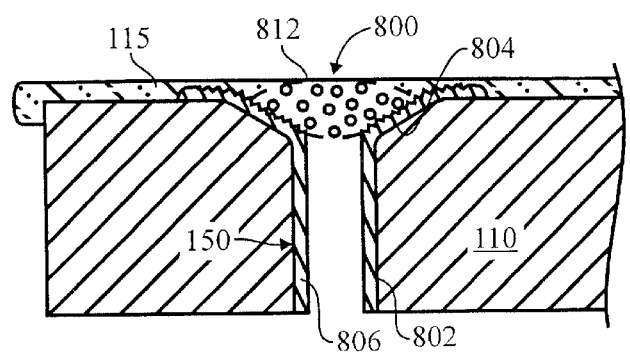
Figure 13D:
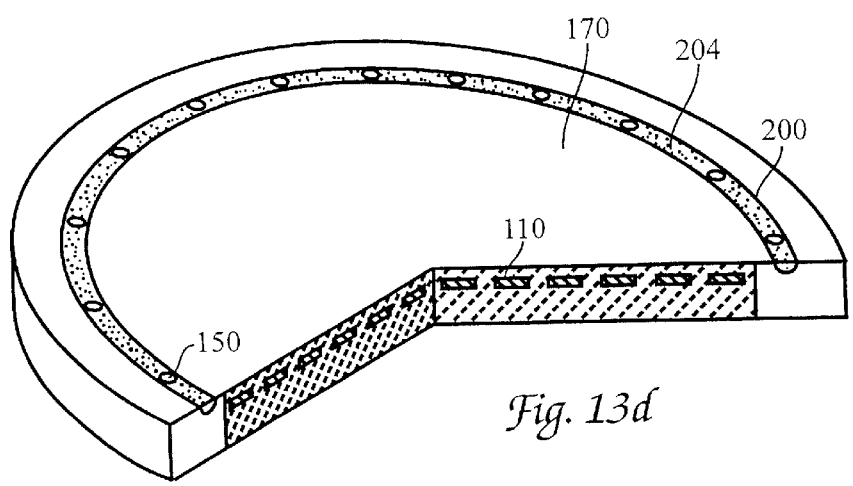
FIG. 13d is a partial sectional perspective view of an electrostatic chuck fabricated according to FIGS. 13a through 13c.

Another structure suitable for forming the electrical isolator 200 comprises a porous plug 800, the manufacture of which is shown in FIGS. 13a to 13d. The porous plug 800 has substantially continuous pores, and/or interconnected microcracks and pores that forms continuous pathways that allow heat transfer gas to flow through the plug 800, while simultaneously deactivating or limiting plasma formation in the conduit 150. Referring to FIG. 13a, a hole having a straight walled inlet 802 and a tapered outlet 804 is bored through the electrode 110 to form a gas flow conduit 150. Thereafter, an underlying dielectric layer 806 is deposited on the sidewalls of the conduit 150, and the surface 810 of the dielectric layer 806 at the outlet 804 is roughened, for example by grit blasting, to form a rough serrated surface that provides strong mechanical adherence of the porous plasma deactivating material, and of the dielectric member 115 overlying the conduit. Preferably, the dielectric layer is deposited by plasma spraying to provide rough surfaces yielding better adhesion. A tapered conically shaped porous plug 800 is formed over the roughed surface to fill the outlet of the conduit 150, by for example, thermal spraying. Alternatively, as shown in FIG. 13d, one or more conduits 150 terminating in circular grooves 805 are formed in the surface of the chuck 100, a layer of dielectric material 806 is deposited in the groove 805 and roughened, and a porous covering 803 is filled in the groove 805. Preferably, at least one groove 805 is formed in the peripheral edge of the electrode 110 to cool the peripheral edge of the substrate. This configuration has the further advantage of facilitating manufacture by allowing the underlying dielectric layer 806 and the porous covering 803 to be deposited by rotating the chuck 100 under the applicator nozzle of the spraying apparatus. Preferably, plasma or flame spraying is used to form the porous plug structure 800 to obtain a high porosity plug. Thereafter, the overlying dielectric member 115 is deposited on the plug 800 to hold the plug in place, as shown in FIG. 13b. Either an opening is drilled only through the dielectric member 115 (not shown) and stopped on the top surface of the porous plug 800; or the surface of the dielectric member is ground or ablated until the apex 812 of the plug is exposed, as shown in FIG. 13c, allowing heat transfer gas to flow through the porous pathways in the plug.

In the embodiments shown in FIGS. 13a to 13c, the tapered outlet 804 comprises a nonvertical surface which allows firm adherence and uniform deposition of a thermally sprayed dielectric member 115. It has been discovered that when a thermally sprayed coating is applied to a perpendicular surface, i.e., in the same plane as the spraying direction of the spraying process, the solidified spray has low adhesion on the vertical surfaces and forms loose grains near the corners and edges of the vertical surfaces resulting in spalling and flaking off of the dielectric member 115. Thus, preferably, the outlet 804 of the conduit 150 has non-vertical surfaces that define a tapered region therebetween. The tapered region is also configured to reduce the penetration of plasma into the conduits 150, the sloped non-vertical walls forming an apex at the surface of the chuck. The porous plug 800 is deposited in the tapered region to substantially entirely fill the tapered region of the outlet. Typically, the outlet 804 has tapered sides that form an angle of about 26° with a vertical axis through the conduit, and comprises a first smaller diameter of at least about 1 mm, and a second large diameter of less than about 5 mm.

In yet another method of fabrication, the electrical isolators 200 are formed by filling the outlet 204 of the conduit 150 with porous material. The outlet 204 of the conduit 150 forms an annular ring that extends continuously along, and adjacent to, the circumferential perimeter of the chuck, as shown in FIG. 13d, to provide heat transfer gas below the entire perimeter of the substrate 55. Preferably, granules of dielectric material mixed with organic binder are packed in the outlet 204 of the conduit 150, and sintered to form granular material bonded to the inner surfaces of the conduit 150 having convoluted passageways and interconnected pores. Because the dimensions of the resultant interconnecting pores tend to be roughly equal to the size of the granules, it is also preferred to use ceramic granules having an average mean diameter of less than or equal to about 0.4 mm, and more preferably less than or equal to 0.25 mm. Preferably, the granules consist of the same material as the dielectric member 115 to increase their adhesion to the inner surface of the gas conduits 155 and reduce thermal stresses. Thereafter, a layer of ceramic material is deposited over the electrical isolator 200, and a gas flow or gas pressure is maintained in the electrical isolator 200 during deposition of the overlying dielectric layer to prevent plugging of pre-drilled holes or pores of the porous materials. After the dielectric member 115 is formed on the surface of the chuck 100, a thickness of about 200 to 250 $\mu$m of the top surface of the dielectric member is ground or ablated to expose the underlying electrical isolator 200. The grinding process is performed using a diamond grit-coated grinding wheel that is registered accurately relative to the chuck 100 to grind-off the correct thickness of the dielectric layer, and deionized water grinding fluid is used to reduce contamination.

Figure 14:
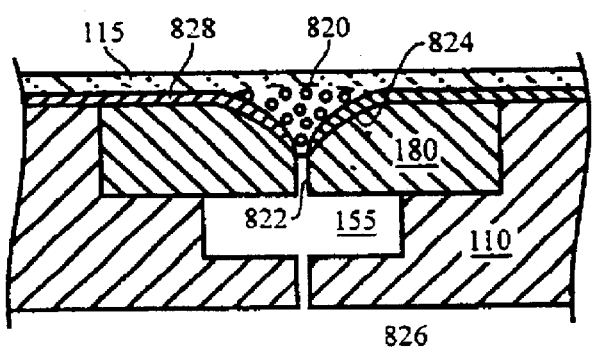
FIG. 14 is a schematic side view of an electrical isolator comprising porous material covered by dielectric.

Another embodiment of the porous plug configuration 820 is shown in FIG. 14. In this version, a hole having a straight walled inlet 822 and a tapered outlet 824 having a continuously varying multi-radius sidewalls, is bored through an annular ring 180 to form the gas flow conduit. The annular ring is mounted in a cavity in the electrode 110 so that the ring 180 rests upon ledges 826 in the base. Thereafter, an underlying dielectric member 828 is deposited on the outlet 824 of the conduit and adjacent surfaces of the electrode 110. A tapered conically shaped porous plug 800 is formed over an underlying dielectric member 828 to substantially fill the outlet 824 by a suitable deposition method, such as for example thermal spraying, and more preferably by plasma or flame spraying. Thereafter, an overlying dielectric member 115 is deposited on the plug 800 to hold the plug in place. Either an opening is drilled only through the dielectric member 115 (not shown) and stopped on the top surface of the porous plug 820 without drilling through the plug; or the surface of the dielectric member is ground or ablated until the apex of the plug is exposed (not shown) allowing heat transfer gas to flow through the porous pathways in the plug.

Semiconducting Dielectric Member

In another aspect, the present invention is directed to an electrostatic chuck 100 comprising one or more electrodes 110 covered by, and more preferably embedded in, a dielectric member having semiconducting properties that provides fast charging and discharging response time and rapid chucking and dechucking of substrates 55 held on the chuck 100. The semiconducting dielectric member 115 can be used in conjunction with the electrical isolators 200 or separately without using the electrical isolators 200. The dielectric member 115 comprises a unitary body of semiconducting dielectric material covering or enclosing the electrode 110 therein, as shown in FIGS. 2 and 4b; or one or more layers of semiconducting dielectric material covering an electrically conductive electrode 110 that serves as the electrode 110, as shown in FIG. 3a. In both versions, the semiconducting dielectric member 115 comprises a top surface 170 that is configured to support a substrate 55 and to extend continuously below the substrate 55. Upon application of a voltage to the electrode 110, the semiconducting properties of the dielectric member 115 allow rapid accumulation of electrostatic charge in the dielectric member, particularly at the interface between the dielectric member and the substrate 55. For electrostatic charge to accumulate in the dielectric member 115 the semiconducting material has to be sufficiently leaky to allow a small leakage current to flow from the electrode 110 through the dielectric member 115. If the leakage current is too small, chucking speed is slow, and substrate processing throughput is reduced. Conversely, an excessively high leakage current can damage the active devices formed on the substrate 55.

The amperage of the leakage current that can be tolerated in the chuck 100 also depends upon the voltage applied to the electrode 110. The higher the applied voltage, the larger the leakage current that can be tolerated without completely losing the electrostatic clamping force from excessive current leakage through the semiconducting dielectric member 115. However, the maximum operating voltages that can be used to electrostatically hold semiconductor substrates are limited to about 2000 volts, and if exceeded, can cause charge-up damage of the active devices in the substrate 55.

Thus, the leakage current provided by the semiconducting material should be sufficiently low to retain electrostatic charge in the dielectric member 115, during operation the chuck at voltage levels of about 100 to about 1500 volts. It has been discovered that optimal leakage currents from the dielectric member 115, that provide quick charging response times, without damaging the devices on the substrate, are at least about 0.001 mAmps/cm$^2$, and more preferably from about 0.002 mAmp/cm$^2$ to about 0.004 mAmp/cm$^2$. A suitable leakage current is achieved by controlling the resistivity of the semiconducting dielectric member 115. Thus, preferably, the resistivity of the semiconducting dielectric member 115 is sufficiently low to allow conductance of a low amperage leakage current that provides a quick charging time of less than about 3 seconds, and more preferably less than about 1 second. The semiconducting dielectric member 115 also has a resistivity sufficiently low to provide rapid dissipation of accumulated electrostatic charge when the voltage applied to the electrode 110 is turned off. Preferably, the resistivity of the semiconducting dielectric member 115 is sufficiently low to allow accumulated electrostatic charge to substantially entirely discharge or dissipate in less than about 1 second, and more preferably in less than about 0.5 second. Conventional dielectric members typically have dechucking times of 5 to 10 seconds, which is about five to ten times longer than that provided by semiconducting dielectric member of the present invention.

While a low resistance semiconducting dielectric member 115 is desirable for rapid chucking and dechucking, a chuck having an excessively low resistance dielectric member will allow excessive charge to leak out. The resistance of the semiconducting dielectric member 115 needs to be sufficiently high to maintain a supply of electrostatic charge at the interface of the chuck 100 and substrate 55, even though a portion of the electrostatic charge leaks or dissipates through the member 115. Any leakage current allows electrostatic charge to continually dissipate from the dielectric member 115. Thus, electrostatic charge must accumulate at the dielectric/substrate interface at a rate equal to or greater than the rate of charge dissipation to provide an equilibrium mode in which a supply of accumulated electrostatic charge is maintained at the dielectric/substrate interface.

In a preferred version, the semiconducting dielectric member 115 comprises a resistance in a preferred range of resistivity $\Delta\rho$ that provides such a combination of opposing properties. The resistivity range $\Delta\rho$ of the semiconducting dielectric member 115 is defined by (i) a first lower resistivity $\rho_L$ that is sufficiently low to allow a leakage current to flow from the electrode when the operating voltage is applied to the electrode to form accumulated electrostatic charge at the interface of the substrate 55 and the semiconducting dielectric member 115; and (ii) a second higher resistivity $\rho_H$ that is sufficiently high to maintain accumulated electrostatic charge at the interface during operation of the chuck without use of excessively high operating voltages that damage the substrate. The optimal range $\Delta\rho$ of resistivity of the semiconducting dielectric member 115 is preferably from about $5\times10^9$ to about $8\times10^{10}$ $\Omega$cm, and more preferably from about $1\times10^{10}$ to about $5\times10^{10}$ $\Omega$cm. This range of resistivity is substantially lower than conventional dielectric members which have resistivities exceeding $1\times10^{11}$ $\Omega$cm, and more often exceeding $1\times10^{13}$ $\Omega$cm.

The semiconducting dielectric member 115 having the described properties can be fabricated from ceramic materials, polymers, and mixtures thereof. Suitable ceramic materials include (i) oxides such as $Al_2O_3$, $BeO$, $SiO_2$, $Ta_2O_5$, $ZrO_2$, $CaO$, $MgO$, $TiO_2$, $BaTiO_3$, (ii) nitrides such as AlN, TiN, BN, $Si_3N_4$), (iii) borides such as $ZrB_2$, $TiB_2$, $VB_2$, $W_2B_3$, $LaB_6$, (iv) silicides such as $MoSi_2$, $WSi_x$, or $TiSi_x$, or (v) silicon carbide. Preferably, the semiconducting dielectric member 115 having a resistivity in the preferred range of resistivities of $\Delta\rho$ comprises a composition of aluminum oxide doped with (i) transition metals or metal oxides, such as for example, Ti, Cr, Mn, Co, Cu, $TiO_2$, $Cr_2O_3$, $MnO_2$, CoO, CuO, and mixtures thereof; (ii) alkaline earth metals or oxides, such as for example, Ca, Mg, Sr, Ba, CaO, MgO, SrO, or BaO; or (iii) a combined oxide formulation, such as for example, $CaTiO_3$, $MgTiO_3$, $SrTiO_3$, and $BaTiO_3$. The dopant material is added in a sufficient quantity to provide semiconducting properties to the aluminum oxide dielectric material. By semiconducting it is meant a material having a conductivity in between that of a metal and an insulator.

Preferably, the dielectric member 115 comprises a unitary body of multiple layers of semiconductor and/or insulating material enclosing the electrodes, each layer typically having a thickness of from about 10 $\mu$m to about 500 $\mu$m. The dielectric member 115 comprises a cover layer that electrically isolates the substrate 55 from the electrode 110, and a support layer which supports the electrode and electrically isolates the electrode 110 from a conductive electrode 110. The material and thickness of the cover layer are selected to allow the DC voltage applied to the electrode to electrostatically hold the substrate by means of Coulombic or Johnsen-Rahbek electrostatic attractive forces. The thickness of the layer covering the electrode is typically from about 100 $\mu$m to about 300 $\mu$m. Preferably, material of the cover layer comprises a dielectric constant of at least about 2. Additionally, a protective coating (not shown) can be applied on the exposed surface of the dielectric member to protect the semiconductor layer from erosive processing environments A preferred composition of the semiconducting dielectric member comprises aluminum oxide doped with titanium oxide in a weight percent content of at least about 8 wt %, and preferably at least about 12 wt %. Whereas, pure aluminum oxide has a resistivity of $10^{14}$ $\Omega$cm and a characteristic charging response time of about $10^3$ seconds; the highly doped aluminum oxide has a resistivity typically ranging from about $5\times10^9$ $\Omega$cm to about $8\times10^{10}$ $\Omega$cm. It is believed that the low resistivity results from titanium-metal rich grains or grain boundaries that are formed in the aluminum oxide material, titanium-metal rich regions comprising $Ti^{3+}$ in solid solution in the aluminum oxide structure. However, the resistivity can also be dependent upon microstructural factors other than $Ti^{3+}$ formation, for example, formation of highly conductive $Al_xTi_yO_z$ phases within the alumina grains or at grain boundary regions. Formation of highly conductive titanium-metal rich alumina grains is particularly prevalent when the $TiO_2$—$Al_2O_3$ mixture is exposed to an oxygen-deficient or reducing environment, such as an inert gas environment during fabrication.

The semiconducting dielectric member 115 operates by Johnsen-Rahbek forces providing a higher electrostatic clamping force for relatively low chuck voltages. The low chuck voltages reduce the potential for damage to active regions in the substrate 55. Also, the lower chuck voltages reduce the risk of plasma generation at the dielectric/substrate interface. The semiconductor dielectric is sufficiently leaky that upon application of a voltage to the electrode, the semiconducting dielectric member allows rapid accumulation of electrostatic charge at the dielectric/substrate interface. Furthermore, the low resistance semiconducting layer 115 provides electrostatic charge dissipation response times of less than about 1 second, and more typically less than about 0.5 seconds, with little or no residual charge or sticking forces. The extremely low charging and charge dissipation response time provides rapid chucking and dechucking with the electrostatic holding force rising almost instantaneously with applied voltage, and decreasing almost instantaneously to zero when the applied voltage is turned off. Also, unlike conventional ceramic formulations, the resistivity of the highly doped alumina coatings did not appear to change during use at temperatures ranging from $-10°$ C. to $100°$ C. These novel and unexpected advantages of the semiconducting dielectric member 115 provide significant benefits for electrostatic chucks.

Figure 15:
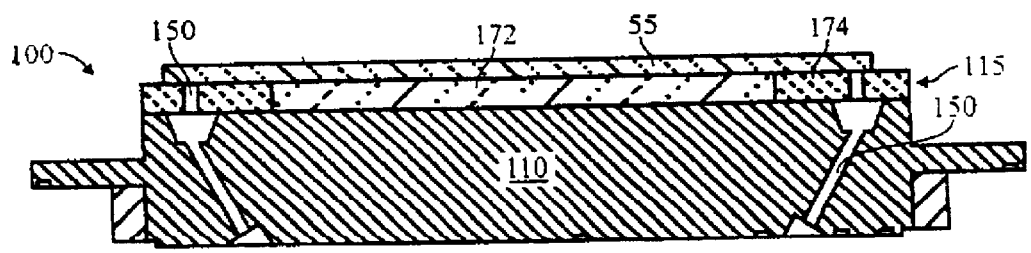
FIG. 15 is a schematic side view of the electrostatic chuck comprising a composite dielectric layer having a first dielectric layer (such as a semiconducting dielectric) covering a central portion of the electrode, and a second dielectric layer (such as an insulator or dielectric) covering a peripheral portion of the electrode.

In yet another aspect of the invention, as shown in FIG. 15, a composite dielectric member 115 comprising a first dielectric material 172 having first electrical properties; and a second dielectric material 174 having second electrical properties, is used to cover the electrode 110 (which is illustrated as a base 105 that serves as the electrode, but also includes the embedded electrode version). In a preferred configuration, the first dielectric material 172 is disposed over a central portion of the electrode 110 (which is substantially entirely covered by the substrate 55 during operation of the chuck 100); and the second dielectric material 174 is disposed over a peripheral portion of the electrode 110, and the top surface 170 configured to support the substrate extends across the first dielectric material 172 and across at least a portion of the second dielectric material 174. The second dielectric material 174 comprises an annular rim extending around the first dielectric material 172 that is peripheral to the first dielectric material 172. This configuration allows tailoring of the properties of the composite dielectric layers across the radial surface of the chuck. This is desirable to provide different electrical properties at the edge of the chuck which is closer to the plasma sheath than the center which is covered by the substrate.

The properties of the first and second dielectric members 172, 174 are tailored to achieve different electrical properties at different portions of the chuck 100. For example, the first dielectric member 172 can comprise a semiconducting material as described above. During operation of the chuck 100, the first dielectric member is substantially entirely covered by the substrate which serves as a dielectric material that electrically insulates the semiconducting layer and reduces shorting between the semiconducting layer and the plasma. In this version, the second dielectric member 174 comprises an insulator that has a higher resistivity than the semiconducting dielectric member to prevent plasma discharge at the exposed peripheral portions of the chuck. The resistivity of the insulating second dielectric member 174 is sufficiently high to prevent electrical discharge or arcing between the surrounding plasma environment and the peripheral portions of the chuck electrode. Preferably, the second dielectric member 174 has a resistance of at least about $1\times10^{11}$ $\Omega$cm, and more preferably from about $10^{13}$ $\Omega$cm to about $1\times10^{20}$ $\Omega$cm. This configuration prevents shorting and arcing between the leaky semiconducting dielectric member and the plasma and the resultant pinholes in the dielectric member that cause failure of the chuck. In another example, the composite dielectric coating 115 can comprise a first dielectric member 172 having a first dielectric breakdown strength, and a second dielectric member 174 having a second dielectric breakdown strength. Preferably, the second dielectric breakdown strength is higher than the first dielectric breakdown strength to prevent plasma discharge or electrostatic charge neutralization at the peripheral edge of the chuck.

The composite dielectric member 115 can also be made from multiple vertically stacked layers. For example, a multilayer composite dielectric member 115 can comprise (i) an $Al_2O_3$—$TiO_2$ layer providing semiconducting electrical properties; and (ii) a more insulative second layer, such as polyimide, Teflon®, $SiO_2$, or $ZrO_2$. For example, the multilayer structure can be tailored to provide increased electrostatic charge retention at the top surface 170 of the chuck, and/or faster electrostatic charge accumulation and dissipation response times through the body of the dielectric member. This can be accomplished by forming a thin second dielectric member having a high resistivity over a first dielectric member having a lower resistivity. Because the electrostatic force is largely attributable to the charge concentrated near the surface of the dielectric member 115, such multilayer coatings, can provide excellent surface charge retention characteristics, without affecting charge dissipation from the underlying layer. The multiple dielectric members preferably comprise a combination of semiconducting and insulator dielectric members.

The semiconducting or composite dielectric member 115 can be formed by a variety of conventional methods, as apparent to those skilled in the art, including for example, isostatic pressing, thermal spraying, sputtering, CVD, PVD, solution coating, or sintering a ceramic block with the electrode 110 embedded therein; as would be apparent to those skilled in the art. In the methods described below, the semiconducting dielectric member 115 is used to cover at least a portion of the electrically conductive base that serves as the electrode 110, or is used to cover or entirely enclose an electrode 110 to form an electrostatic member that can be supported by the base.

A preferred method of forming a unitary dielectric member 115 with an embedded electrode uses a pressure forming apparatus, such as an autoclave, platen press or isostatic press. Isostatic presses are preferred because they apply a more uniform pressure on the dielectric member and electrode assembly. Typical isostatic press comprise a pressure resistant steel chamber having a diameter ranging from about 1 to 10 feet. A pressurized fluid is used to apply pressure on an isostatic molding bag. A powdered precursor is prepared comprising a suitable ceramic compound as described above is mixed with an organic binder selected to burn off during sintering. The precursor is placed along with the electrode structure in the isostatic molding bag and the bag is inserted in the isostatic press. The fluid in the pressure chamber is pressurized to apply an isostatic pressure on the dielectric assembly. It is desirable to simultaneously remove air trapped in the isostatic molding bag using a vacuum pump to increase the cohesion of the powdered precursor. The unitary dielectric member/electrode assembly is removed from the molding bag and sintered to form a unitary dielectric with the electrode embedded. The gas flow conduits 150 are formed in the dielectric member by conventional techniques, such as drilling, boring, or milling. Preferably, at least some of the conduits 150 terminate at the periphery of the chuck 100, to provide heat transfer gas to the peripheral edge of the substrate 55.

After deposition, the surface of the dielectric member 115 is fine ground to obtain a highly flat surface to efficiently electrically and thermally couple the substrate 55 on the chuck 100. In a typically high density plasma, the driving point RF bias impedance presented by the plasma is very low. To achieve uniform ion flux energy to the substrate 55 it is necessary to uniformly couple RF energy from the plasma through the substrate 55 to provide a constant plasma sheath voltage across the surface of the substrate 55. Nonuniform plasma sheath voltages result different processing rates or attributes across the substrate surface. The uniformity of the plasma sheath voltage is a function of the impedance/area of the plasma sheath, the substrate 55, the gap between the substrate 55 and the chuck 100, and the chuck 100. A nonuniform impedance or rough surface on the chuck 100 creates uneven impedances between the chuck and the substrate, resulting in nonuniform plasma sheath voltage. Thus, it is desirable for the chuck 100 to have a substantially flat and planar dielectric member 115 to provide uniform impedance in the gap between the dielectric member 115 and the substrate. Besides providing strong electrical coupling, a flat and smooth dielectric member also provides strongly thermally coupling and good heat transfer properties from the substrate 55 to the chuck 100. Thus conventional diamond grinding wheels are used to grind the semiconducting dielectric member 115 to a surface roughness of about 0.007±0.001 mm, which is typically less than about 30 rms.

Alternatively, the dielectric member 115 can comprise a layer of dielectric material formed directly on the electrode 110 or base 105 using thermal spraying methods, such as for example, plasma glow discharge spraying, flame spraying, electric wire melting, electric-arc melting, and detonation gun techniques, as described below. Prior to use of the thermal spraying methods, the upper surface of the electrode 110 or base 105 (which to avoid repetition are collectively referred to herein as electrode 110), that is typically made of a conductive metal such as aluminum or copper, is abraded by grit blasting to provide a roughened surface that enhances adhesion of the dielectric member 115. In the grit blasting process, the surface of the electrode 110 is blasted at a predetermined grit spray incidence angle. Furthermore, by rotating the base during blasting, microscopic grooves are formed which undercut the aluminum surface to provide mechanical interlocking of a dielectric member that is subsequently formed on the grooved and undercut surface. In this process, the electrode 110 is fixed to a rotating turntable that rotates the electrode 110 around a centerline. The grit is blasted onto the surface of the electrode 110 using a nozzle oriented at an angle to the surface of the base. The nozzle travels from the outer edge to the center of the base at a variable speed to maintain the depth and the pitch of the grit blasted grooves. Typically, the rate of nozzle travel increasing as the nozzle moves from the outer edge toward the center. For example, an aluminum electrode 110 was fixed to a turntable which rotated at about 20 to 30 revolutions per minute (rpm), and the angle of incidence of the nozzle relative to surface of the aluminum electrode 110 was about 70°. A grit of particle size of about 60 to 80 mesh, was grit blasted using a paint removal type nozzle, onto the base. The height of the grit blasted grooves was about 0.025 mm (0.001 inch), and their pitch was about 0.073 mm (0.003 inch).

After preparation of the surface of the electrode 110, a coating of semiconducting material is formed on the electrode 110. Preferably, a thermal spraying process is used to apply the selected ceramic formulation. For example, an alumina-titania composition is sintered to form a homogeneous frit, and ground to form a fine particle sized ceramic powder having an average particle size ranging from about 10 to about 100 $\mu$m. The spraying process partially melts and energetically impacts the ceramic powder onto the electrode 110. Typically, the electrode 110 is maintained at a temperature of about 60° C. to about 80° C., and the ceramic powder is thermally sprayed at an angle of about 80° to 90° (nearly perpendicular) to the surface of the base. The thermally sprayed coatings can bounce-off the surface, so it is important to apply the coating at a proper angle to the base to reduce microcracking and provide dense layers. The high kinetic energy of the molten fine ceramic particles provide a dense, low porosity, dielectric member having the desired semiconducting properties and low resistivity. The semiconducting dielectric member 115 should be sufficiently dense to completely electrically insulate the electrode 110 of the chuck 100. A low or zero electrical resistance at any point in the semiconducting dielectric member 115 can result in an electrical short. Low electrical resistance can occur when the semiconducting dielectric member 115 is damaged during spraying, i.e., by large macroscopic cracks; or if the dielectric coating is too porous and allows plasma to permeate through the pores and electrically short the dielectric member 115. After cooling, the peel strength of the thermally sprayed alumina/titania was tested using ASTM methods and found to have improved by about 20% over that obtained using other coating methods.

Figure 16:
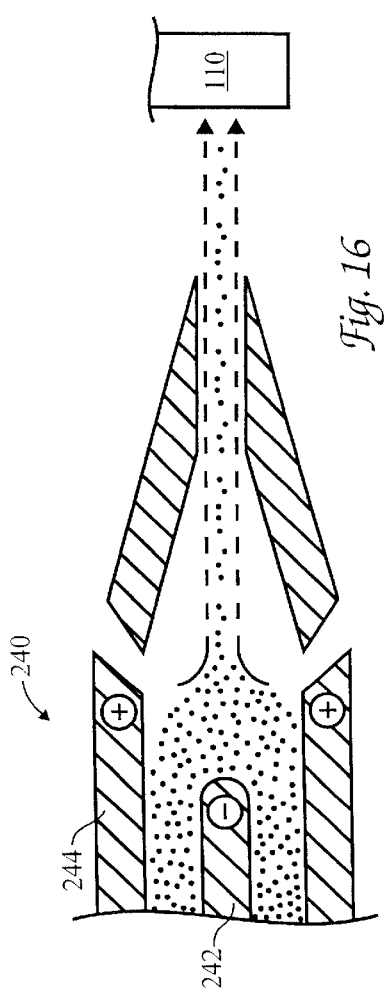
FIG. 16 is a schematic view of a plasma glow discharge spraying apparatus.

Different thermal spray methods of forming the semiconducting layer 115 will now be described. Referring to FIG. 16, a plasma glow discharge spraying process uses a plasma gun 240 consists of a cone-shaped cathode 242 inside a cylindrical anode 244 which forms a nozzle. An ionizable inert gas, typically argon, argon/hydrogen, or argon/helium, is flowed through the plasma zone between the electrically biased anode and cathode where it is ionized to form a plasma. Ceramic powders injected into the plasma zone are accelerated and melted by the high temperature plasma. Molten droplets are propelled onto the electrode 110, where they solidify and accumulate to form a thick, well-bonded, and dense semiconducting dielectric member 115. The process has sufficient thermal energy to completely melt high temperature ceramic materials, such as alumina and/or titania.

Figure 17:
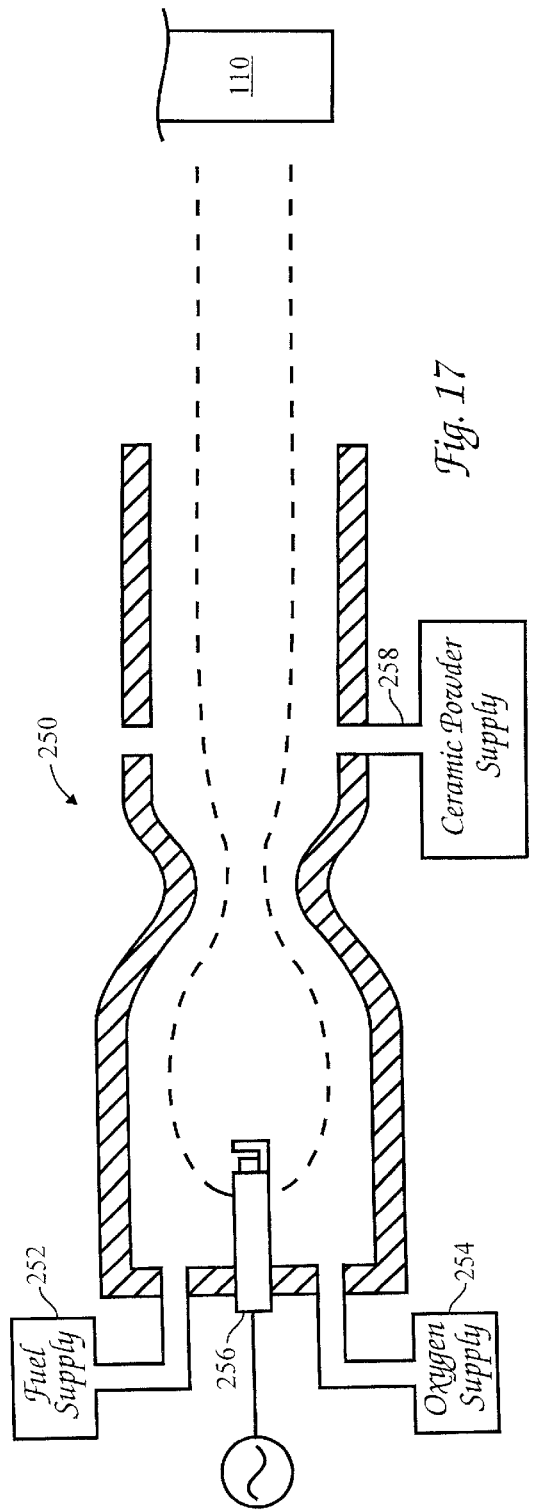
FIG. 17 is a schematic view of a detonation gun flame spray apparatus.

In the flame spraying method, a highly combustible mixture of acetylene and oxygen is used to melt a sprayed ceramic powder sprayed through the flame. In this method, a high temperature flame is produced using a combustible mixture of gases, for example acetylene and oxygen, as shown in FIG. 17. A typical flame spraying gun 250 comprises a fuel supply 252 and an oxygen supply 254. The oxygen enriched fuel mixture is ignited by a sparking means, such as a spark plug 256. The resultant high velocity ignited gas melts the ceramic particles injected through the nozzle 258 and the molten particles impinge on the electrode 110. The flame spraying method provides a relatively low heat or energy input to the ceramic powder. The low kinetic energy ceramic particles travel relatively slowly from the flame to the surface of the electrode 110 allowing the particle to cool during travel. As a result of the cooling, and the relatively low kinetic energy impact on the electrode 110 the solidified plasma-deactivating material comprises spherical ceramic particles that retain their shape, providing pores and tortuous pathways between the particles that provide a high surface area.

Another method comprises a detonation gun technique (not shown). In this method, a rapidly expanding mixture of ignited gases imparts a high kinetic energy to powdered ceramic material that provides a dense coating on impact with the electrode 110. In the detonation gun, a series of detonation explosion are used to provide extremely high energy molten ceramic particles that impact the electrode 110 to form a very dense ceramic material having novel electrical properties. The high velocity detonation melts and expels the ceramic particles from a gun like nozzle directed toward the electrode 110. Typically, the hot expanded gases comprise a velocity of about 600 m/sec (2000 ft/sec) to about 900 m/sec (3000 ft/sec), and a succession of such detonations provide the resultant coating thickness on the substrate.

Figure 18:
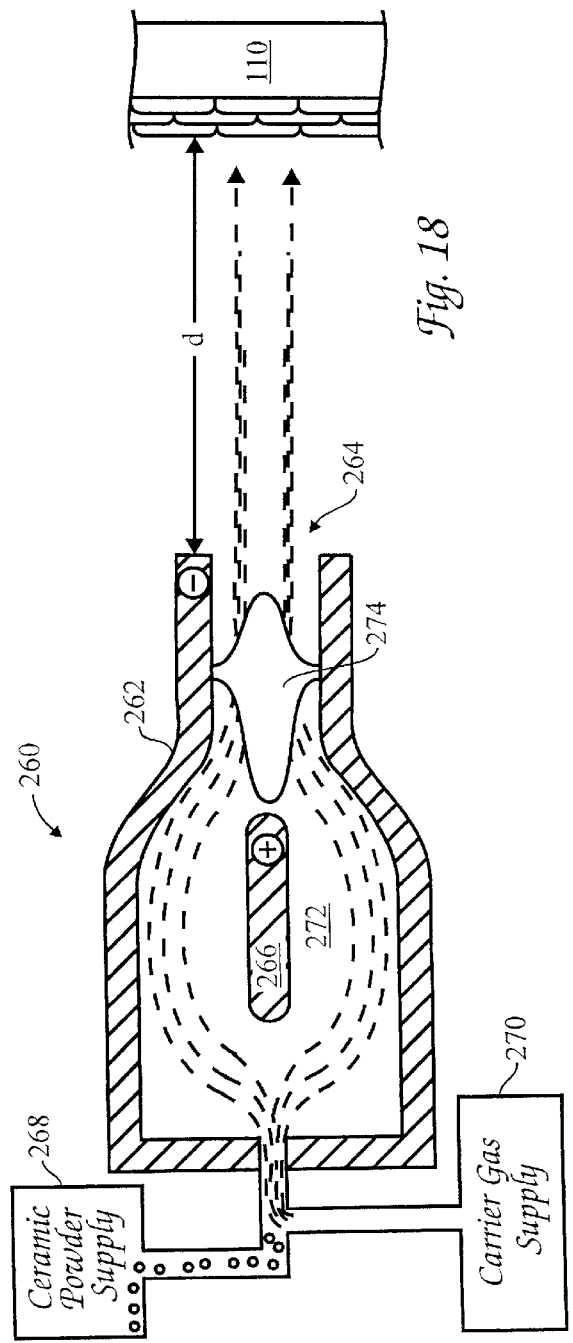
FIG. 18 is a schematic view of an electrode arc spraying apparatus.
Figure 19:
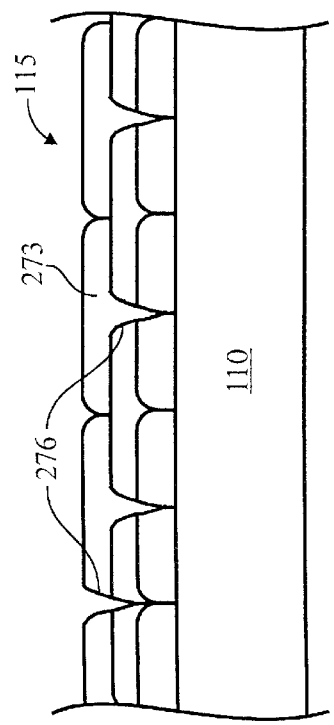
FIG. 19 is a schematic sectional view of a preferred grain structure of a semiconducting dielectric layer formed on an electrode using the apparatus of FIG. 18.

Preferably, the dielectric member 115 is formed by an electric arc melting method, as shown in FIGS. 18 and 19. A typical electric arc melter comprises a circular ring-shaped cathode 262 with a hole 264 therethrough, and a needle-shaped anode 266 centered within the cathode (as shown in FIG. 18) or adjacent to the cathode (not shown). The fine ceramic powder from a source 268 is sprayed around the anode using carrier gas from a carrier gas supply 270, at a feeding rate of about 2 to about 10 gm/min. The powdered ceramic material is transported by a carrier gas through the channels 272 on either side of the needle-shaped anode 266 and is directed through the opening 264 having a diameter of about 1 to 10 mm. An electric arc 274 is formed by applying a voltage V sufficiently high to substantially entirely melt the ceramic powder being sprayed into the arc. The ceramic powder melts in the high temperature electric arc 274 and highly energetically impinges on the electrode 110. Also, important in the electric arc melting process is the distance d between the ring-shaped cathode 262, the anode nozzle 266, and the substrate 55, commonly referred to as the spray distance. The distance d between the arcing electrodes and the chuck electrode is selected so that the ceramic powder impinges on the chuck electrode in a substantially molten state. In one version, the distance d may be from about 50 to about 400 nm.

The carrier gas that is used to transport the ceramic powder can be an inert gas, a reducing gas, or an oxidizing gas. A reducing gas can increase formation of non-stoichiometric transition metal compounds in the alumina to reduce the resistivity of the ceramic while retaining its mechanical properties. Also, oxidizing gas are generally undesirable because they cause excessive oxidation of the alumina resulting in high resistivity dielectric members 115. Preferably, the carrier gas comprises a non-reactive gas, such as an inert gas, for example, argon, helium, or xenon. Most preferably, argon gas is used to transport the ceramic particles at a flow rate of about 20 to 100 l/min.

The ceramic powder sprayed into the electric arc 274 melts while passing through the highly energetic and extremely hot electric arc 274 to form molten droplets that impinge on the electrode 110. The energized molten grains impinge on the base and rapidly solidify due to conduction and convection cooling at the incident surface. The in-flight convection cooling of the molten droplets is minimized by the high kinetic energy imparted to the molten droplets by the electric arc. This restricts grain growth and improves homogeneity by reducing segregation of impurities. Although the mechanism is not understood, it was discovered that the electric arc melting process provided flattened ceramic grains (schematically illustrated in FIG. 19), small grain sizes, and grain boundary compositions that give rise to entirely different electrical and thermal properties, such as the controlled electrical resistivity desired in the semiconducting layer. Of primary importance is the droplet velocity and temperature, which are controlled by the ratio of the kinetic energy to heat input provided by the electric arc melting process to the ceramic powder traveling through the arc. The high kinetic energy and heat input provided to the ceramic particles by the electric arc melting process results in a high speed "splatting" of molten particles on the surface of the electrode 110 causing spreading of the particles, rapid cooling from 500–600° C. to room temperature, and solidification in about 15–20 microseconds. This provides a dense coating with the required distribution of conductive titania species in the alumina composition. The electric arc melting methods provided highly dense $Al_2O_3/TiO_2$ compositions having resistivities of from 1 to $5\times10^{11}$ μ-cm. Scanning electron microscope (SEM) photomicrographs showed dense coatings with homogeneously dispersed porosity of less than about 10%, and often less than about 5%.

The thermally sprayed ceramic coatings form submicron microcracks 276 upon cooling and solidification that permit the dielectric member 115 to expand or stretch to conform with the differential thermal expansion between the dielectric member 115, electrode 110, and/or electrical isolators 200, without forming large-sized cracks or delaminating from the underlying electrode 110. Large cracks allow plasma to enter through the microcracks 276 thereby damaging the electrode 110 and dielectric member 115. However, small microcracking is desirable as long as the cracks are submicron sized, relatively uniformly distributed, and formed along inhomogeneous grains and grain boundaries without propagating through the entire thickness of the dielectric member 115. Such controlled microcracking prevents delamination and cracking-off of the dielectric member 115 from the thermal expansion stresses at high process temperatures. For example, microcracking prevents aluminum oxide containing dielectric member 115 (which has a thermal expansion close to that of pure alumina of about $4.3\times10^{-6}$ in/in/° F.) from delaminating and separating from the underlying aluminum electrode 110 (which has a much higher thermal expansion of about $13\times10^{-6}$ in/in/° F.).

Although the present invention has been described in considerable detail with regard to the preferred version thereof, other versions are possible. For example, the semiconducting dielectric member 115 can be used in other applications, and can be fabricated from equivalent compositions that provide quick chucking and dechucking response times. Also, the electrical isolator 200 can be fabricated in many other shapes and forms that are equivalent in function to the illustrative structures herein. Therefore, the appended claims should not be limited to the description of the preferred versions contained herein.

What is claimed is:

1. An electrostatic chuck comprising:
   (a) an electrode capable of being electrically charged to electrostatically hold a substrate; and
   (b) a composite layer covering the electrode, the composite layer comprising:
      (1) a first dielectric material covering a central portion of the electrode; and
      (2) a second dielectric material covering a peripheral portion of the electrode, the second dielectric material having a different composition than the composition of the first dielectric material,
         wherein the composite layer comprises a surface configured to support the substrate, the surface extending across (i) the first dielectric material and (ii) at least a portion of the second dielectric material.

2. An electrostatic chuck according to claim 1 wherein the first dielectric material comprises a resistivity of from about $5\times10^9$ Ωcm to about $8\times10^{10}$ Ωcm, and the second dielectric material comprises a resistivity of from about $1\times10^{11}$ to about $1\times10^{20}$ Ωcm.

3. An electrostatic chuck according to claim 1 wherein the first dielectric material is shaped as a disc and the second dielectric material is shaped as a rim about the disc.

4. An electrostatic chuck according to claim 1 wherein the first dielectric material comprises aluminum oxide and at least about 8 wt % titanium oxide.

5. An electrostatic chuck according to claim 1 wherein the chuck further comprises:
   (i) at least one heat transfer fluid conduit extending through the electrode to allow passage of heat transfer fluid to the surface of the composite layer; and
   (ii) a plasma-deactivating material in an outlet of the conduit, the plasma-deactivating material capable of reducing plasma formation in the conduit in plasma environments.

6. An electrostatic chuck according to claim 1 wherein the thickness of the composite layer is from about 100 μm to about 300 μm.

7. An electrostatic chuck according to claim 1 wherein the surface is substantially planar.

8. An electrostatic chuck according to claim 1 wherein the composite layer comprises a unitary body.

9. An electrostatic chuck according to claim 1 wherein the first and second dielectric materials comprise thermally sprayed coatings.

10. An electrostatic chuck according to claim 1 wherein the surface extends continuously below the substrate.

11. An electrostatic chuck comprising:
   (a) an electrode capable of being electrically charged to generate an electrostatic charge to hold a substrate; and
   (b) a composite layer covering the electrode, the composite layer comprising:
      (1) a first dielectric material covering a central portion of the electrode, the first dielectric materal having a resistivity of from about $5\times10^9$ Ω cm to about $8\times10^{20}$ Ω cm; and
      (2) a second dielectric material covering a peripheral portion of the electrode, the second dielectric material having a resistivity of from about $1\times10^{11}$ to about $1\times10^{20}$ Ω cm; and
   wherein the composite layer comprises a surface configured to support the substrate, the surface extending across (i) the first dielectric material and (ii) at least a portion of the second dielectric material.

12. An electrostatic chuck according to claim 11 wherein the first dielectric material comprises aluminum oxide and at least about 8 wt % titanium oxide.

13. A substrate processing chamber comprising an electrostatic chuck according to claim 1 and further comprising:
   (1) a gas distributor for introducing a gas into the chamber;
   (2) a plasma generator that couples RF energy into the gas in the chamber; and
   (3) a throttled exhaust to exhaust gas from the chamber.

14. An electrostatic chuck according to claim 11 wherein the thickness of the composite layer is from about 100 μm to about 300 μm.

15. An electrostatic chuck according to claim 11 wherein the surface is substantially planar.

16. An electrostatic chuck comprising:
   (a) an electrode capable of being electrically charged to electrostatically hold a substrate; and
   (b) a composite layer covering the electrode, the composite layer comprising:
      (i) a first dielectric layer covering at least a portion of the electrode, the first dielectric layer having a first resistivity in a range Δρ defined by:
         (1) a first lower resistivity $\rho_L$ that is sufficiently low
            (i) to allow a leakage current to flow from the electrode when an electrical charge is applied to the electrode to form accumulated electrostatic charge in the first dielectric layer, and (ii) to allow the accumulated electrostatic charge to dissipate in less than about 1 second, when the electrical charge applied to the electrode is terminated; and
(2) a second higher resistivity $\rho_H$ that is sufficiently high to maintain the accumulated electrostatic charge in the first dielectric layer during operation of the chuck; and
(ii) a second dielectric layer covering a peripheral portion of the electrode, the second dielectric layer having a second resistivity that is greater than the first resistivity,
wherein the composite layer comprises a surface configured to support the substrate, the surface extending across (i) the first dielectric layer and (ii) at least a portion of the second dielectric layer.

17. An electrostatic chuck according to claim 16 further comprising:
(i) at least one heat transfer fluid conduit extending through the electrode to allow passage of heat transfer fluid to the surface of the composite layer; and
(ii) a plasma-deactivating material in an outlet of the conduit, the plasma-deactivating material capable of reducing plasma formation in the conduit in plasma environments.

18. A substrate processing chamver comprising an electrostatic chuck according to claim 16 and further comprising:
(1) a gas distributor for introducing a gas into the chamber;
(2) a plasma generator the couples RF energy into the gas in the chamber; and
(3) a throttled exhaust to exhaust gas from the chamber.

19. An electrostatic chuck according to claim 16, wherein the thickness of the composite layer is from about 100 µm to about 300 µm.

20. An electrostatic chuck according to claim 16 wherein in the surface is substantially planar.

* * * * *